United States Patent
Kuo et al.

(10) Patent No.: US 12,315,569 B2
(45) Date of Patent: May 27, 2025

(54) DIFFERENTIAL MEMORY CELL ARRAY STRUCTURE FOR MULTI-TIME PROGRAMMING NON-VOLATILE MEMORY

(71) Applicant: eMemory Technology Inc., Hsin-Chu (TW)

(72) Inventors: Jui-Ming Kuo, Hsinchu County (TW); Hung-Yi Liao, Hsinchu County (TW); Wei-Ren Chen, Hsinchu County (TW); Wein-Town Sun, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 562 days.

(21) Appl. No.: 17/691,161

(22) Filed: Mar. 10, 2022

(65) Prior Publication Data

US 2023/0014498 A1    Jan. 19, 2023

Related U.S. Application Data

(60) Provisional application No. 63/221,013, filed on Jul. 13, 2021.

(51) Int. Cl.

| | |
|---|---|
| *G11C 16/14* | (2006.01) |
| *G11C 16/04* | (2006.01) |
| *G11C 16/08* | (2006.01) |
| *G11C 16/24* | (2006.01) |
| *G11C 16/26* | (2006.01) |
| *H10B 41/00* | (2023.01) |

(52) U.S. Cl.
CPC .......... *G11C 16/14* (2013.01); *G11C 16/0441* (2013.01); *G11C 16/08* (2013.01); *G11C 16/24* (2013.01); *G11C 16/26* (2013.01); *H10B 41/00* (2023.02)

(58) Field of Classification Search
CPC ..... G11C 16/14; G11C 16/0441; G11C 16/08; G11C 16/24; G11C 16/26; G11C 16/10; G11C 16/28; H10B 41/00; H10B 41/10; H10B 41/30; H10B 41/60; H01L 29/42328; H01L 29/7883
See application file for complete search history.

(56) References Cited

U.S. PATENT DOCUMENTS

| | | | |
|---|---|---|---|
| 6,765,825 B1 * | 7/2004 | Scott ................. | G11C 16/28 365/185.01 |
| 8,139,411 B1 | 3/2012 | Pesavento | |
| 9,627,066 B1 | 4/2017 | Pasotti et al. | |
| 2004/0004861 A1 | 1/2004 | Srinivas et al. | |
| 2008/0266959 A1 * | 10/2008 | Haggag ............. | G11C 16/0433 365/185.11 |
| 2019/0115076 A1 * | 4/2019 | Chen ................. | G06F 7/588 |
| 2021/0287746 A1 * | 9/2021 | Chen ................. | H01L 27/0207 |

FOREIGN PATENT DOCUMENTS

EP      3667670 A1 *  6/2020  ......... G11C 14/0018

* cited by examiner

*Primary Examiner* — Mushfique Siddique
(74) *Attorney, Agent, or Firm* — WPAT, PC

(57) ABSTRACT

A differential memory cell array structure for a MTP non-volatile memory is provided. The array structure is connected to a source line, a word line, a bit line, an inverted bit liner and an erase line. After an erase operation (ERS) is completed, the stored data in the differential memory cells of the selected row are not all erased. That is, only the stored data in a single selected memory cell of the selected row is erased.

7 Claims, 12 Drawing Sheets

|      | SL  | WL1   | BL1    | BL1'   | EL    | $V_{NW1}$ |
|------|-----|-------|--------|--------|-------|-----------|
| PGM  | Vpp | Vpp/2 | 0V/FLT | FLT/0V | Vpp/2 | Vpp       |
| READ | Vr  | Von   | 0V     | 0V     | 0V    | Vr        |
| ERS  | 0V  | 0V    | 0V     | 0V     | Vee   | 0V        |
FIG. 2A
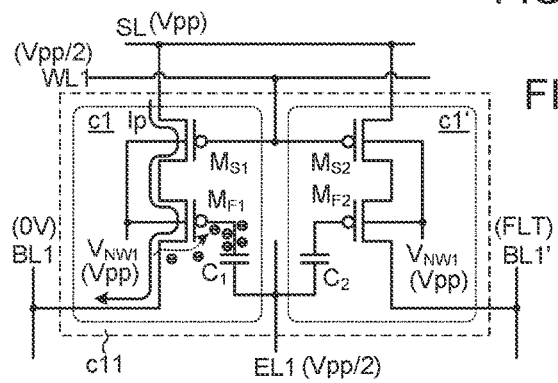
FIG. 2B
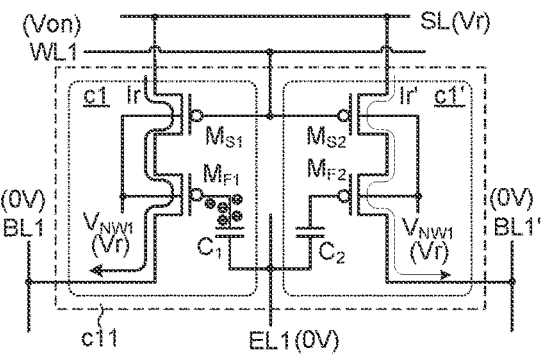
FIG. 2C
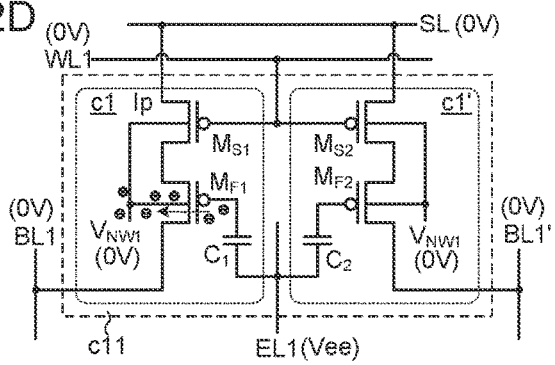
FIG. 2D

DIFFERENTIAL MEMORY CELL ARRAY STRUCTURE FOR MULTI-TIME PROGRAMMING NON-VOLATILE MEMORY

This application claims the benefit of U.S. provisional application Ser. No. 63/221,013, filed Jul. 13, 2021, the subject matter of which is incorporated herein by reference.

FIELD OF THE INVENTION

The present invention relates to a memory cell array structure, and more particularly to a differential memory cell array structure for a multi-time programming non-volatile memory.

BACKGROUND OF THE INVENTION

As is well known, a non-volatile memory is able to continuously retain data after the supplied power is interrupted. For example, a multi-time programming non-volatile memory (also referred as a MTP non-volatile memory) is one kind of non-volatile memory. After a program operation is performed on the non-volatile memory by the user, the data can be stored in the non-volatile memory. Moreover, after a read operation is performed on the non-volatile memory by the user, the stored data in the non-volatile memory can be read. Moreover, after an erase operation is performed on the non-volatile memory by the user, the stored data in the non-volatile memory are deleted.

Generally, plural memory cells of the non-volatile memory are collaboratively formed as a memory cell array structure. The memory cell array structure is connected with plural signal lines. For example, the signal lines include word lines, bit lines, erase lines, and so on. By providing proper bias voltages to these signal lines, the program operation, the read operation or the erase operation is selectively performed on the memory cell of the memory cell array structure.

However, the array structure design of the conventional non-volatile memory still has some drawbacks. When an erase operation (e.g., a chip erase operation or a segment erase operation) is performed on the array structure, the stored data of all memory cells in an area of the array structure is erased. For example, when the segment erase operation is performed, the data of 256 memory cells in the corresponding segment of the array structure are all erased. In other words, it is unable to perform the erase operation on a single memory cell of the array structure of the conventional non-volatile memory.

SUMMARY OF THE INVENTION

An embodiment of the present invention provides a differential memory cell array structure. The differential memory cell array structure includes a first select transistor, a first floating gate transistor, a first capacitor, a second select transistor, a second floating gate transistor and a second capacitor. A first source/drain terminal of the first select transistor is connected to a first source line. A gate terminal of the first select transistor is connected to a first word line. A body terminal of the first select transistor receives a first well region voltage. A first drain/source terminal of the first floating gate transistor is connected to a second drain/source terminal of the first select transistor. A second drain/source terminal of the first floating gate transistor is coupled to a first bit line. A body terminal of the first floating gate transistor receives the first well region voltage. A first terminal of the first capacitor is connected to a floating gate of the first floating gate transistor. A second terminal of the first capacitor is connected to a first erase line. A first source/drain terminal of the second select transistor is connected to the first source line. A gate terminal of the second select transistor is connected to the first word line. A body terminal of the second select transistor receives the first well region voltage. A first drain/source terminal of the second floating gate transistor is connected to a second drain/source terminal of the second select transistor. A second drain/source terminal of the second floating gate transistor is coupled to a first inverted bit line. A body terminal of the second floating gate transistor receives the first well region voltage. A first terminal of the second capacitor is connected to a floating gate of the second floating gate transistor. A second terminal of the second capacitor is connected to the first erase line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 2A is a bias voltage table illustrating the bias voltages for performing a program operation, a read operation and an erase operation on the differential memory cell according to the first embodiment of the present invention;

FIG. 2B is a schematic circuit diagram illustrating associated bias voltages for performing the program operation on the differential memory cell according to the first embodiment of the present invention;

FIG. 2C is a schematic circuit diagram illustrating associated bias voltages for performing the read operation on the differential memory cell according to the first embodiment of the present invention;

FIG. 2D is a schematic circuit diagram illustrating associated bias voltages for performing the erase operation on the differential memory cell according to the first embodiment of the present invention;

DETAILED DESCRIPTION OF PREFERRED EMBODIMENTS

Figure 1A:
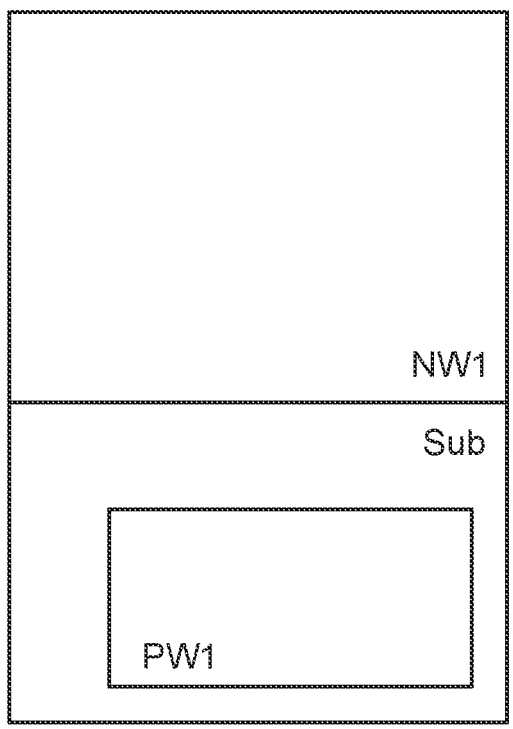
FIGS. 1A, 1B and 1C are schematic views illustrating a manufacturing process of a differential memory cell according to a first embodiment of the present invention.
Figure 1B:
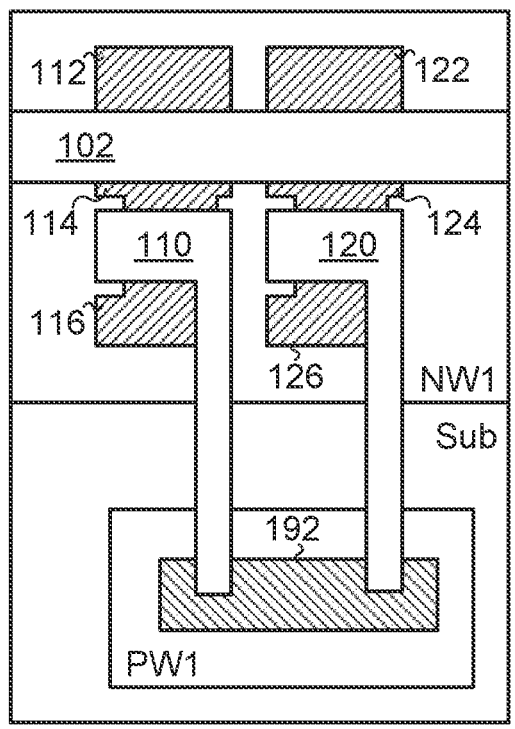
Figure 1C:
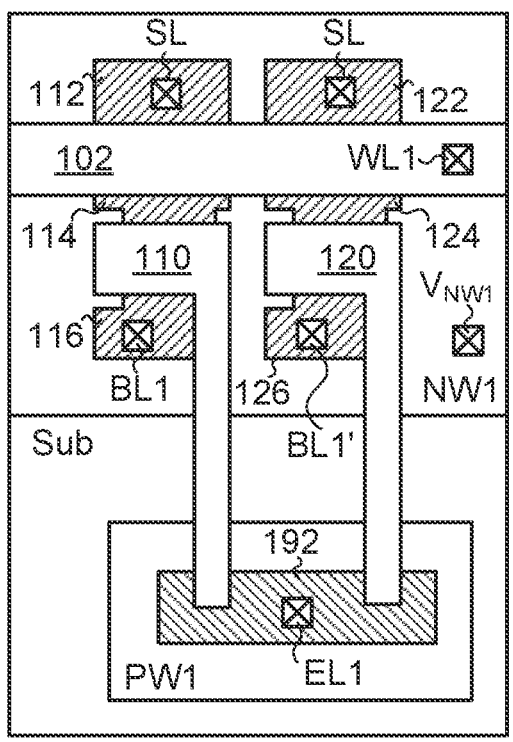
Figure 1D:
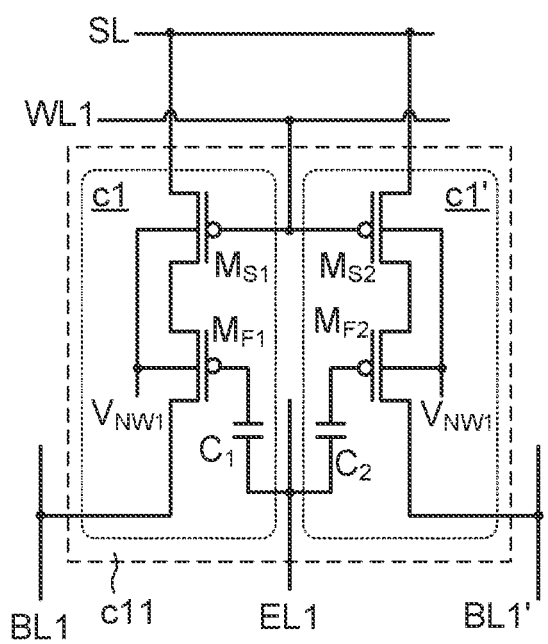
FIG. 1D is a schematic circuit diagram illustrating an equivalent circuit of the differential memory cell according to the first embodiment of the present invention.

FIGS. 1A, 1B and 1C are schematic views illustrating a manufacturing process of a differential memory cell according to a first embodiment of the present invention. FIG. 1D is a schematic circuit diagram illustrating an equivalent circuit of the differential memory cell according to the first embodiment of the present invention.

Please refer to FIG. 1A. Firstly, an N-well region NW1 and a P-well region PW1 are formed in a surface of a semiconductor substrate Sub.

Please refer to FIG. 1B. Then, plural gate structures 102, 110 and 120 are formed. The gate structure 102 covers the N-well region NW1. The gate structures 110 and 120 cover the N-well region NW1. In addition, the gate structures 110 and 120 are extended to the P-well region PW1 through the overlying region of the semiconductor substrate Sub. That is, the gate structures 110 and 120 cover both of the N-well region NW1 and the P-well region PW1. Each of the gate structures 102, 110 and 120 comprises a gate oxide layer and a polysilicon gate layer. The gate oxide layer covers the surface of the semiconductor substrate Sub. The polysilicon gate layer covers the gate oxide layer.

Then, a first doping process is performed to form plural p-type doped regions 112, 114, 116, 122, 124 and 126 in the N-well region NW1. The p-type doped region 112 is located beside a first side of the gate structure 102. The p-type doped region 114 is arranged between a second side of the gate structure 102 and a first side of the gate structure 110. The p-type doped region 116 is located beside a second side of the gate structure 110. The p-type doped region 122 is located beside the first side of the gate structure 102. The p-type doped region 124 is arranged between the second side of the gate structure 102 and a first side of the gate structure 120. The p-type doped region 126 is located beside a second side of the gate structure 120.

Then, a second doping process is performed to form an n-type doped region 192 in the P-well region PW1. As shown in FIG. 1B, the portions of the gate structures 110 and 120 extended to the P-well region PW1 are located beside n-type doped region 192.

It is noted that the sequence of performing the two doping processes may be exchanged. That is, the n-type doped region 192 is formed in the P-well region PW1 after the first doping process, and the p-type doped regions 112, 114, 116, 122, 124 and 126 are formed in the N-well region NW1 after the second doping process.

Please refer to FIG. 1C. Then, a connection process is performed to form plural metal contact lines. The metal contact line connected to the p-doped regions 112 and 122 is served as a source line SL. The metal contact line connected to the p-doped region 116 is serves as a bit line BL1. The metal contact line connected to the p-doped region 126 is served as an inverted bit line BL1'. The metal contact line connected to the gate structure 102 is served as a word line WL1. The metal contact line connected to the n-doped region 192 is served as an erase line EL1. In addition, a metal contact line is connected to the N-well region NW1, and thus the N-well region NW1 receives a well region voltage $V_{NW1}$.

As shown in FIG. 1D, the differential memory cell c11 comprises two sub-cells c1 and c1'. The structures of the two sub-cells c1 and c1' are identical.

The sub-cell c1 comprises a select transistor $M_{S1}$, a floating gate transistor $M_{F1}$ and a capacitor $C_1$. The select transistor $M_{S1}$ is defined by the N-well region NW1, the p-type doped region 112, the p-type doped region 114 and the gate structure 102 collaboratively. The floating gate transistor $M_{F1}$ is defined by the N-well region NW1, the p-type doped region 114, the p-type doped region 116 and the gate structure 110 collaboratively. The capacitor $C_1$ is defined by the gate structure 110 and the n-doped region 192 collaboratively. The first source/drain terminal of the select transistor $M_{S1}$ is connected to the source line SL. The gate terminal of the select transistor $M_{S1}$ is connected to the word line WL1. The first drain/source terminal of the floating gate transistor $M_{F1}$ is connected to the second drain/source terminal of the select transistor $M_{S1}$. The second drain/source terminal of the floating gate transistor $M_{F1}$ is connected to the bit line BL1. The first terminal of the capacitor $C_1$ is connected to a floating gate of the floating gate transistor $M_{F1}$. The second terminal of the capacitor $C_1$ is connected to the erase line EL1. Moreover, a body terminal of the transistor $M_{S1}$ and a body terminal of the floating gate transistor $M_{F1}$ receive the well region voltage $V_{NW1}$.

The sub-cell c1' comprises a select transistor $M_{S2}$, a floating gate transistor $M_{F2}$ and a capacitor $C_2$. The select transistor $M_{S2}$ is defined by the N-well region NW1, the p-type doped region 122, the p-type doped region 124 and the gate structure 102 collaboratively. The floating gate transistor $M_{F2}$ is defined by the N-well region NW1, the p-type doped region 124, the p-type doped region 126 and the gate structure 120 collaboratively. The capacitor $C_2$ is defined by the gate structure 120 and the n-doped region 192 collaboratively. The first source/drain terminal of the select transistor $M_{S2}$ is connected to the source line SL. The gate terminal of the select transistor $M_{S2}$ is connected to the word line WL1. The first drain/source terminal of the floating gate transistor $M_{F2}$ is connected to the second drain/source terminal of the select transistor $M_{S2}$. The second drain/source terminal of the floating gate transistor $M_{F2}$ is connected to the inverted bit line BL1'. The first terminal of the capacitor $C_2$ is connected to a floating gate of the floating gate transistor $MF_2$. The second terminal of the capacitor $C_2$ is connected to the erase line EL1. Moreover, a body terminal of the transistor $M_{S2}$ and a body terminal of the floating gate transistor $M_{F2}$ receive the well region voltage $V_{NW1}$.

FIG. 2A is a bias voltage table illustrating the bias voltages for performing a program operation, a read operation and an erase operation on the differential memory cell according to the first embodiment of the present invention. FIG. 2B is a schematic circuit diagram illustrating associated bias voltages for performing the program operation on the differential memory cell according to the first embodiment of the present invention. FIG. 2C is a schematic circuit diagram illustrating associated bias voltages for performing the read operation on the differential memory cell according to the first embodiment of the present invention. FIG. 2D is a schematic circuit diagram illustrating associated bias voltages for performing the erase operation on the differential memory cell according to the first embodiment of the present invention.

Please refer to FIGS. 2A and 2B. When the program operation (PGM) is performed on the differential memory cell c11, the source line SL receives a program voltage Vpp, the word line WL1 receives a half of the program voltage (Vpp/2), the erase line EL1 receives a half of the program voltage (Vpp/2), the bit line BL1 receives a ground voltage (0V), and the inverted bit line BL1' is in a floating state (FLT). In addition, the well region voltage $V_{NW1}$ is equal to the program voltage Vpp. For example, the program voltage Vpp is about 10V.

Since the word line WL1 is activated, the select transistor $M_{S1}$ in the sub-cell c1 is turned on. Meanwhile, a program current Ip flows from the source line SL to the bit line BL1 through the select transistor $M_{S1}$ and the floating gate transistor $M_{F1}$. Consequently, hot carriers (e.g., electrons) are injected from the second drain/source terminal of the floating gate transistor $MF_1$ into the floating gate of the floating gate transistor $MF_1$.

In the sub-cell c1', the word line WL1 is activated. However, the inverted bit line BL1' is in the floating state (FLT). Consequently, the sub-cell c1' is unable to generate the program current. Under this circumstance, hot carriers (e.g., electrons) cannot be injected into the floating gate of the floating gate transistor $MF_2$.

That is, if hot carriers are controlled to be stored in the floating gate transistor $M_{F1}$ and no hot carriers are stored in the floating gate transistor $M_{F2}$ after the program operation (PGM) is completed, the differential memory cell c11 is programmed to a first storage state.

On the other hand, if the inverted bit line BL1' receives the ground voltage (0V) and the bit line BL1 is in the floating state (FLT) when the program operation (PGM) is performed, hot carriers are controlled to be stored in the floating gate transistor $M_{F2}$ and no hot carriers are stored in the floating gate transistor $M_{F1}$. Under this circumstance, the differential memory cell c11 is programmed to a second storage state.

As mentioned above, the differential memory cell c11 can be programmed to one of the first storage state and the second storage state when the bias voltages provided to the bit line BL1 and the inverted bit line BL1' are selectively adjusted.

Please refer to FIGS. 2A and 2C. When the read operation (READ) is performed on the differential memory cell c11, the source line SL receives a read voltage Vr, the word line WL1 receives an on voltage Von, the erase line EL1 receives the ground voltage (0V), the bit line BL1 receives the ground voltage (0V), and the inverted bit line BL1' receives the ground voltage (0V). In addition, the well region voltage $V_{NW1}$ is equal to the read voltage Vr. The read voltage Vr is lower than the program voltage Vpp. For example, the read voltage Vr is about 3.3V, and the on voltage Von is equal to the ground voltage (0V).

Please refer to FIG. 2C again. When the read operation (READ) is performed, the word line WL1 is activated, and the select transistors $M_{S1}$ and $M_{S2}$ are turned on. Since hot carriers are stored in the floating gate transistor $M_{F1}$ of the sub-cell c1 and no hot carriers are stored in the floating gate transistor $M_{F2}$ of the sub-cell c1', a read current Ir with a higher magnitude is generated by the sub-cell c1. The read current Ir flows from the source line SL to the bit line BL1 through the select transistor $M_{S1}$ and the floating gate transistor $M_{F1}$. The magnitude of the read current Ir' generated by the sub-cell c1' is nearly zero.

During the read operation (READ), the storage state of the differential memory cell c11 is judged according to the magnitudes of the read currents Ir and Ir' on the bit line BL1 and the inverted bit line BL1', respectively. In the example of FIG. 2C, the magnitude of the read current Ir is higher than the magnitude of the read current Ir'. Consequently, the differential memory cell c11 is determined to be in the first storage state. Whereas, if the magnitude of the read current Ir' is higher than the magnitude of the read current Ir, the differential memory cell c11 is determined to be in the second storage state.

Please refer to FIGS. 2A and 2D. When the erase operation (ERS) is performed on the differential memory cell c11, the source line SL receives the ground voltage (0V), the word line WL1 receives the ground voltage (0V), the bit line BL1 receives the ground voltage (0V), the inverted bit line BL1' receives the ground voltage (0V), and the erase line EL1 receives an erase voltage Vee. In addition, the well region voltage $V_{NW1}$ is equal to the ground voltage (0V). The erase voltage Vee is higher than the program voltage Vpp. For example, the erase voltage Vee is about 15V.

Please refer to FIG. 2D again. When the erase operation (ERS) is performed, the word line WL1 is activated. Since the voltage difference between the erase line EL1 and the body terminal of the floating gate transistor $M_{F1}$ (or the floating gate transistor $M_{F2}$) is equal to the difference between the erase voltage Vee and the well region voltage $V_{NW1}$, i.e., equal to (Vee−0V), the floating gate transistor $M_{F1}$ results in a Fowler-Nordheim (FN) electron tunneling ejection effect. Consequently, the hot carriers are ejected from the floating gate of the floating gate transistor $M_{F1}$ to the body terminal of the floating gate transistor $M_{F1}$. Meanwhile, the erase operation (ERS) is completed.

On the other hand, if the hot carriers are stored in the floating gate of the floating gate transistor $M_{F2}$ When the erase operation (ERS) is performed, the floating gate transistor $M_{F2}$ results in a Fowler-Nordheim (FN) electron tunneling ejection effect. Consequently, the hot carriers are ejected from the floating gate of the floating gate transistor $M_{F2}$ to the body terminal of the floating gate transistor $M_{F2}$. Meanwhile, the erase operation (ERS) is completed. In other words, after the erase operation (ERS) is completed, no hot carriers are stored in the floating gate transistors $M_{F1}$ and $M_{F2}$ in the differential memory cell c11.

Moreover, plural differential memory cells of the first embodiment can be collaboratively formed as a MTP non-volatile memory. That is, the MTP non-volatile memory comprises plural differential memory cells, and the plural differential memory cells are formed as a differential memory cell array structure. In accordance with a feature of the present invention, any differential memory cell of the array structure in the MTP non-volatile memory can be subjected to the erase operation individually.

Figure 3A:
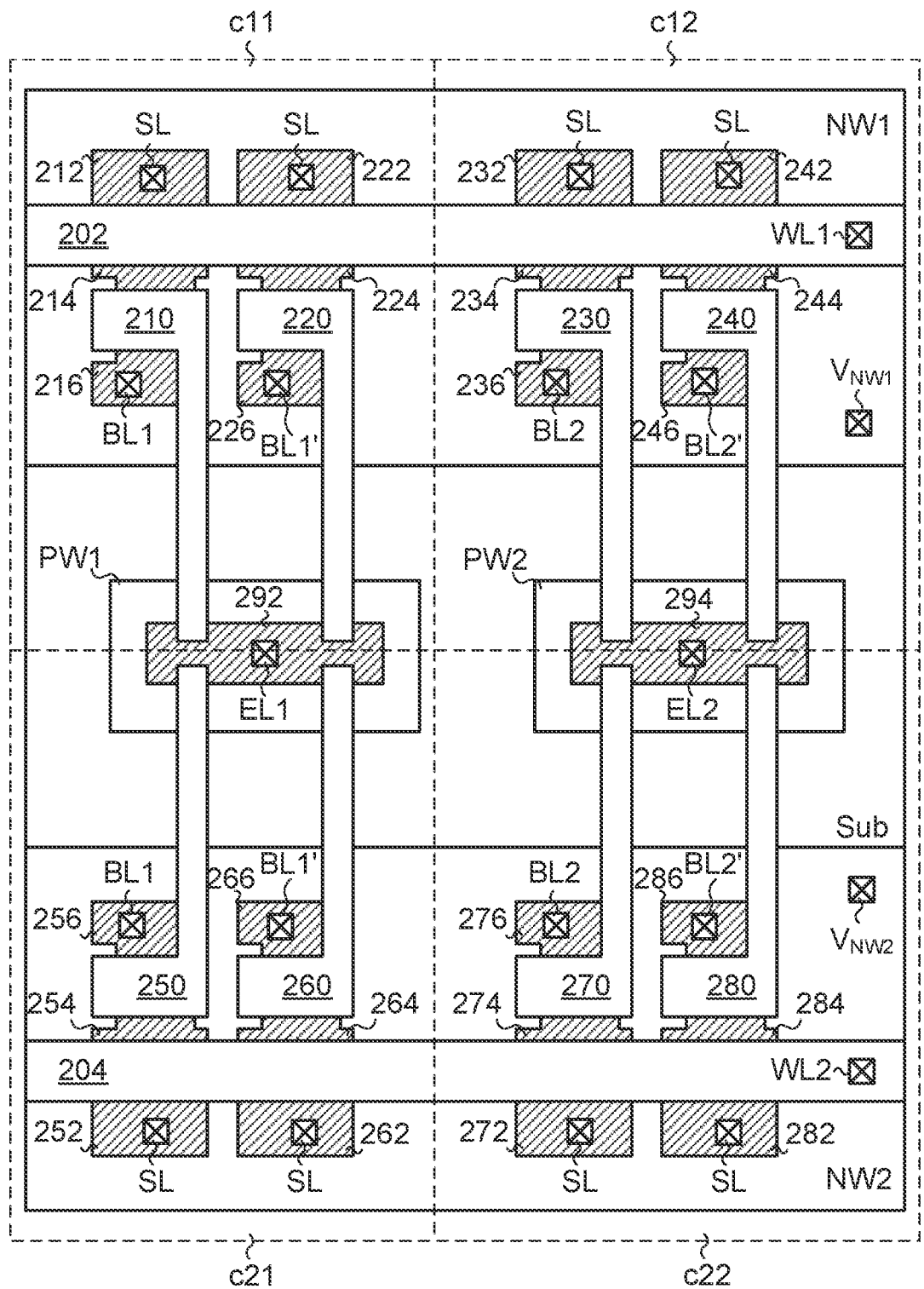
FIG. 3A is a schematic top view illustrating the array structure of a MTP non-volatile memory with plural differential memory cells of the first embodiment.
Figure 3B:
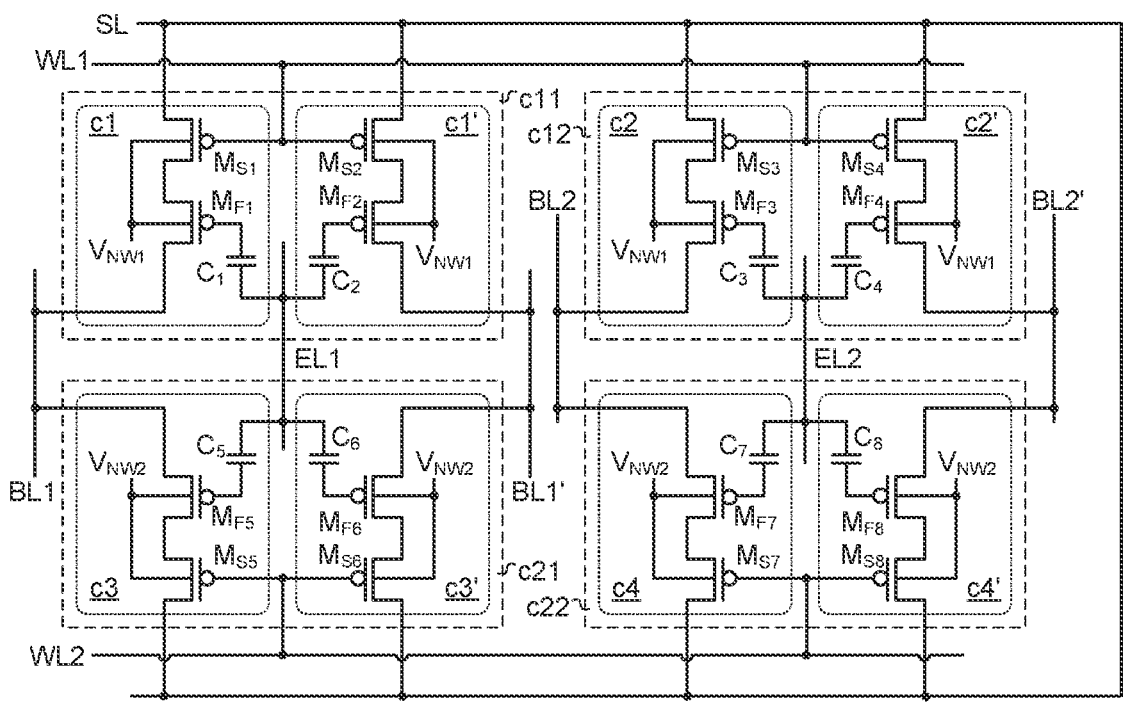
FIG. 3B is a schematic circuit diagram illustrating the equivalent circuit of the array structure as shown in FIG. 3A.

FIG. 3A is a schematic top view illustrating the array structure of a MTP non-volatile memory with plural differential memory cells of the first embodiment. FIG. 3B is a schematic circuit diagram illustrating the equivalent circuit of the array structure as shown in FIG. 3A. The MTP non-volatile memory comprises plural differential memory cells that are arranged in an m×n array, wherein m and n are positive integers. For illustration, the array structure of this embodiment comprises four differential memory cells c11~c22 in a 2×2 array.

A manufacturing process of the array structure as shown in FIG. 3A will be described as follows. Firstly, two N-well regions NW1, NW2 and two P-well regions PW1, PW2 are formed in a surface of a semiconductor substrate Sub. The two N-well regions NW1 and NW2 are discretely located at two opposite sides of the semiconductor substrate Sub, respectively. The two P-well regions PW1 and PW2 are discretely located at a middle region of the semiconductor substrate Sub. In this embodiment, the semiconductor substrate Sub is a P-type semiconductor substrate.

Then, plural gate structures 202, 204, 210, 220, 230, 240, 250, 260, 270 and 280 are formed. The gate structure 202 cover the N-well region NW1. The gate structure 204 cover the N-well region NW2. The gate structures 210 and 220 cover the N-well region NW1 and the P-well region PW1. The gate structures 230 and 240 cover the N-well region NW1 and the P-well region PW2. The gate structures 250 and 260 cover the N-well region NW2 and the P-well region PW1. The gate structures 270 and 280 cover the N-well region NW2 and the P-well region PW2.

Then, a first doping process is performed. Consequently, plural p-type doped regions 212, 214, 216, 222, 224, 226, 232, 234, 236, 242, 244 and 246 are formed in the N-well region NW1, and plural p-type doped regions 252, 254, 256, 262, 264, 266, 272, 274, 276, 282, 284 and 286 are formed in the N-well region NW2. Take the p-type doped regions 212, 214 and 216 for example. The p-type doped region 212 is located beside a first side of the gate structure 202. The p-type doped region 214 is arranged between a second side of the gate structure 202 and a first side of the gate structure 210. The p-type doped region 216 is located beside a second side of the gate structure 210. The locations of the other p-type doped regions are not redundantly described herein.

Then, a second doping process is performed. Consequently, an n-type doped region 292 is formed in the P-well region PW1, and an n-type doped region 294 is formed in the P-well region PW2. The portions of the gate structures 210, 220, 250 and 260 extended to the P-well region PW1 are located beside n-type doped region 292. The portions of the gate structures 230, 240, 270 and 280 extended to the P-well region PW2 are located beside n-type doped region 294.

Then, a connection process is performed to form plural metal contact lines SL, WL1, WL2, BL1, BL1', BL2, BL2', EL1 and EL2. The source line SL is connected to the p-type doped regions 212, 222, 232, 242, 252, 262, 272 and 282. The bit line BL1 is connected to the p-type doped regions 216 and 256. The inverted bit line BL1' is connected to the p-type doped regions 226 and 266. The bit line BL2 is connected to the p-type doped regions 236 and 276. The inverted bit line BL2' is connected to the p-type doped regions 246 and 286. The word line WL1 is connected to the gate structure 202. The word line WL2 is connected to the gate structure 204. The erase line EL1 is connected to the n-doped region 292. The erase line EL2 is connected to the n-doped region 294. The N-well region NW1 receives a well region voltage $V_{NW1}$. The N-well region NW2 receives a well region voltage $V_{NW2}$.

As shown in FIG. 3B, the array structure comprises four differential memory cells c11~c22 in a 2×2 array. The equivalent circuit of each of the differential memory cells c11~c22 is identical to that of FIG. 1D, and not redundantly described herein. The differential memory cell c11 comprises two sub-cells c1 and c1'. The differential memory cell c12 comprises two sub-cells c2 and c2'. The differential memory cell c21 comprises two sub-cells c3 and c3'. The differential memory cell c22 comprises two sub-cells c4 and c4'.

In the array structure of FIG. 3B, the differential memory cells in the same row are constructed in the same well region. For example, the select transistors $M_{S1}$, $M_{S2}$, $M_{S3}$ and $M_{S4}$ and the floating gate transistors $M_{F1}$, $M_{F2}$, $M_{F3}$ and $M_{F4}$ of the two differential memory cells c11 and c12 in the first row are constructed in the N-well region NW1. That is, the body terminals of all transistors of the two differential memory cells c11 and c12 in the first row receive the well region voltage $V_{NW1}$. Similarly, the select transistors $M_{S5}$, $M_{S6}$, $M_{S7}$ and $M_{S8}$ and the floating gate transistors $M_{F5}$, $M_{F6}$, $M_{F7}$ and $M_{F8}$ of the two differential memory cells c21 and c22 in the second row are constructed in the N-well region NW2. That is, the body terminals of all transistors of the two differential memory cells c21 and c22 in the second row receive the well region voltage $V_{NW2}$.

Moreover, the source line SL is connected to all of the differential memory cells c11~c22. That is, the source line SL is connected to the first drain/source terminals of the select transistors $M_{S1}$, $M_{S2}$, $M_{S3}$, $M_{S4}$, $M_{S5}$, $M_{S6}$, $M_{S7}$ and $M_{S8}$.

The word line WL1 is connected to two differential memory cells c11 and c12 in the first row. That is, the word line WL1 is connected to the gate terminals of the select transistors $M_{S1}$, $M_{S2}$, $M_{S3}$ and $M_{S4}$. The word line WL2 is connected to two differential memory cells c21 and c22 in the second row. That is, the word line WL2 is connected to the gate terminals of the select transistors $M_{S5}$, $M_{S6}$, $M_{S7}$ and $M_{S8}$.

The bit line BL1 and the inverted bit line BL1' are connected to two differential memory cells c11 and c21 in the first column. That is, the bit line BL1 is connected to the second drain/source terminals of the floating gate transistors $M_{F1}$ and $M_{F5}$, and the inverted bit line BL1' is connected to the second drain/source terminals of the floating gate transistors $M_{F2}$ and $M_{F6}$. The bit line BL2 and the inverted bit line BL2' are connected to the two differential memory cells c12 and c22 in the second row. That is, the bit line BL2 is connected to the second drain/source terminals of the floating gate transistors $M_{F3}$ and $M_{F7}$, and the inverted bit line BL2' is connected to the second drain/source terminals of floating gate transistors $M_{F4}$ and $M_{F8}$.

In the array structure of FIG. 3B, the differential memory cells in the same row are respectively connected to different erase lines. In other words, the n differential memory cells in the same row are connected to n different erasure lines, respectively. As shown in FIG. 3B, the two differential memory cells c11 and c12 in the first row are connected to the erase lines EL1 and EL2, respectively. That is, the erase line EL1 is connected to the second terminals of the capacitors $C_1$ and $C_2$, and the erase line EL2 is connected to the second terminals of the capacitors $C_3$ and $C_4$. Similarly, the two differential memory cells c21 and c22 in the second row are connected to the erase lines EL1 and EL2, respectively. That is, the erase line EL1 is connected to the second terminals of the capacitors $C_5$ and $C_6$, and the erase line EL2 is connected to the second terminals of the capacitors $C_7$ and $C_8$.

Figures 4A, 4B:
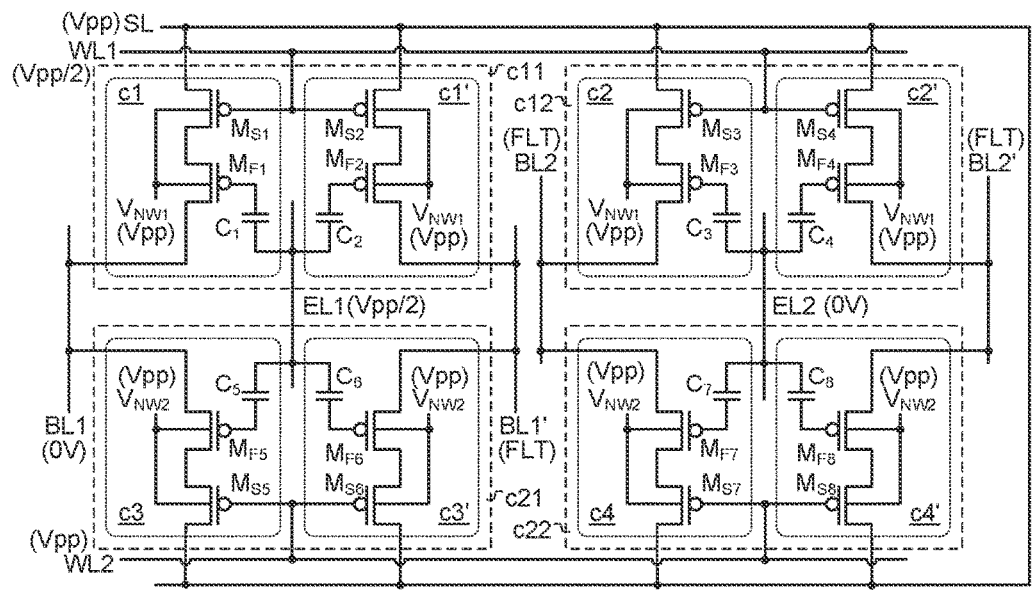
FIG. 4A is a bias voltage table illustrating the bias voltages for performing a program operation, a read operation and an erase operation on the differential memory cell array structure as shown in FIG. 3B.
FIG. 4B is a schematic circuit diagram illustrating associated bias voltages for performing the program operation on the differential memory cell array structure as shown in FIG. 3B.
Figure 4C:
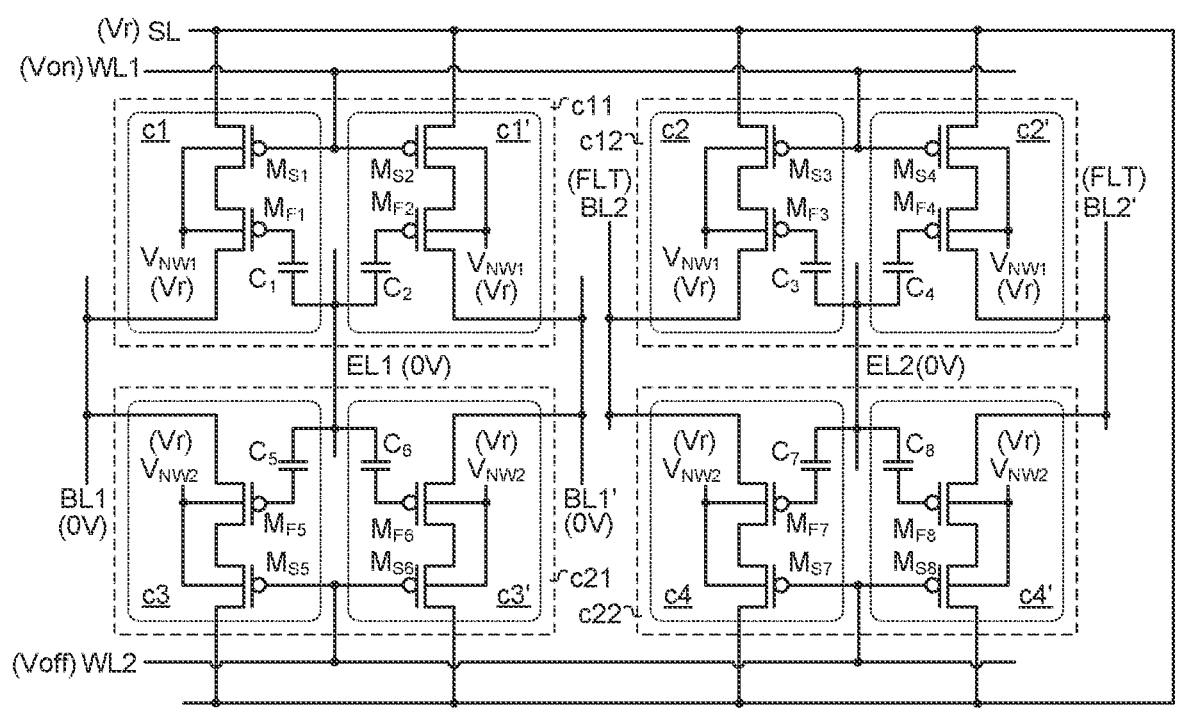
FIG. 4C is a schematic circuit diagram illustrating associated bias voltages for performing the read operation on the differential memory cell array structure as shown in FIG. 3B.
Figure 4D:
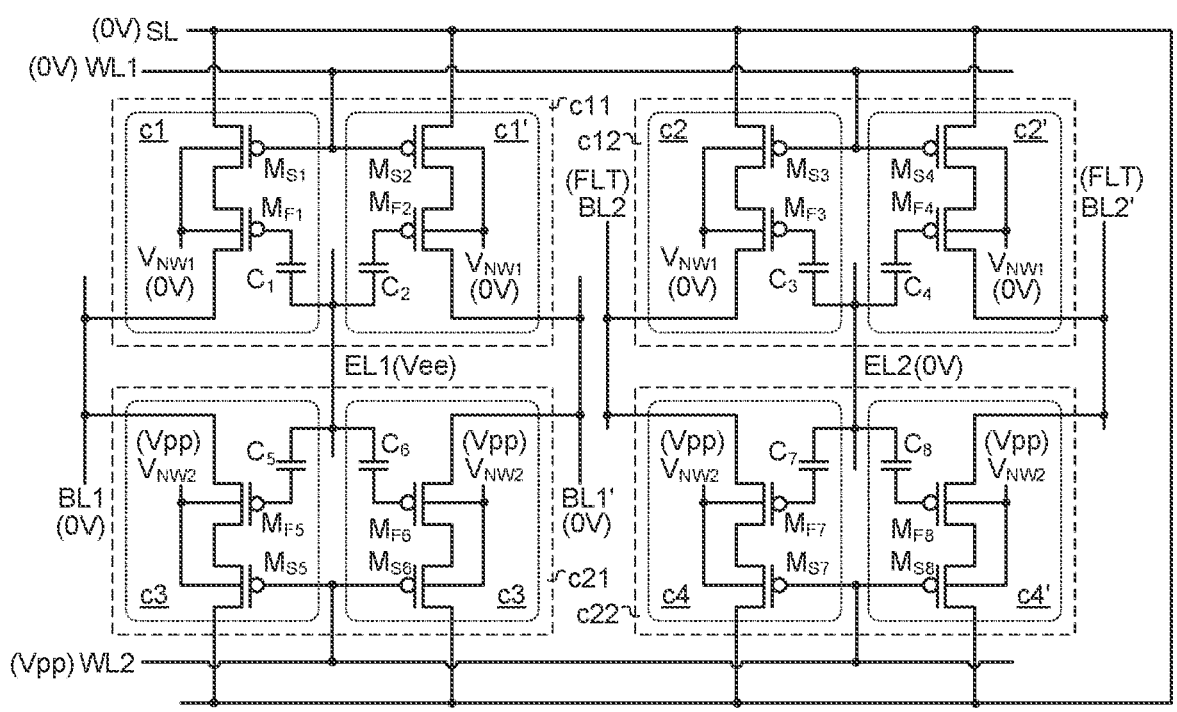
FIG. 4D is a schematic circuit diagram illustrating associated bias voltages for performing the erase operation on the differential memory cell array structure as shown in FIG. 3B.

FIG. 4A is a bias voltage table illustrating the bias voltages for performing a program operation, a read operation and an erase operation on the differential memory cell array structure as shown in FIG. 3B. FIG. 4B is a schematic circuit diagram illustrating associated bias voltages for performing the program operation on the differential memory cell array structure as shown in FIG. 3B. FIG. 4C is a schematic circuit diagram illustrating associated bias voltages for performing the read operation on the differential memory cell array structure as shown in FIG. 3B. FIG. 4D is a schematic circuit diagram illustrating associated bias voltages for performing the erase operation on the differential memory cell array structure as shown in FIG. 3B. In the MTP non-volatile memory of this embodiment, the program operation, the read operation and the erase operation can be selectively performed on any differential memory cell of the array structure. For illustration, the differential memory cell c11 is taken as an example of a selected memory cell. In addition, the program operation, the read operation and the erase operation performed on the selected memory cell will be described as follows.

Please refer to FIGS. 4A and 4B. When the program operation (PGM) is performed, the source line SL receives a program voltage Vpp, the word line WL1 receives a half of the program voltage (Vpp/2), the word line WL2 receives the program voltage Vpp, the bit line BL1 receives a ground voltage (0V), the inverted bit line BL1' is in a floating state (FLT), the bit line BL2 is in the floating state (FLT), the inverted bit line BL2' is in the floating state (FLT), the erase line EL1 receives a half of the program voltage (Vpp/2), and the erase line EL2 receives the ground voltage (0V). In addition, the well region voltage $V_{NW1}$ is equal to the program voltage Vpp, and the well region voltage $V_{NW2}$ is equal to the program voltage Vpp.

Since the word line WL1 receives a half of the program voltage (Vpp/2), the word line WL1 is activated. Moreover, since the first row of the array structure is connected with the word line WL1, the first row is the selected row. Since the word line WL2 receives the program voltage Vpp, the word line WL2 is inactivated. In addition, the second row of the array structure connected to the word line WL2 is the unselected row.

Since the second row is the unselected row, the select transistors $M_{S5}$, $M_{S6}$, $M_{S7}$ and $M_{S8}$ in the differential memory cells c21 and c22 are turned off. Consequently, the differential memory cells c21 and c22 are unable to generate the program current. That is, the differential memory cells c21 and c22 in the unselected row are subjected to the program inhibition.

As mentioned above, the first row is the selected row. In addition, the bit line BL1 receives the ground voltage (0V), the inverted bit line BL1' is in the floating state (FLT), the bit line BL2 is in the floating state (FLT), and the inverted bit line BL2' is in the floating state (FLT). In the first row, the differential memory cell c11 is the selected memory cell, and the differential memory cell c12 is an unselected memory cell. Consequently, the selected memory cell (i.e., the differential memory cell c11) is programmed to the first storage state, and the unselected memory cell c12 is subjected to the program inhibition.

On the other hand, if the bit line BL1 is in the floating state (FLT) and the inverted bit line BL1' receives the ground voltage (0V) when the program operation (PGM) is performed, the differential memory cell c11 is the selected memory cell. Under this circumstance, the selected memory cell is programmed to a second storage state.

Please refer to FIGS. 4A and 4C. When the read operation (READ) is performed, the source line SL receives a read voltage Vr, the word line WL1 receives an on voltage Von, the word line WL2 receives an off voltage Voff, the bit line BL1 receives the ground voltage (0V), the inverted bit line BL1' receives the ground voltage (0V), the bit line BL2 is in the floating state (FLT), the inverted bit line BL2' is in the floating state (FLT), the erase line EL1 receives the ground voltage (0V), and the erase line EL2 receives the ground voltage (0V). In addition, the well region voltage $V_{NW1}$ is equal to the read voltage Vr, and the well region voltage $V_{NW2}$ is equal to the read voltage Vr. For example, the on voltage Von is equal to the ground voltage (0V), and the off voltage Voff is equal to the read voltage Vr.

In the array structure, the word line WL1 receives the on voltage Von. Consequently, the word line WL1 is activated, and the first row connected to the word line WL1 is the selected row. Since the word line WL2 receives the off voltage Voff, the word line WL2 is inactivated. In addition, the second row of the array structure connected to the word line WL2 is the unselected row.

Since the second row is the unselected row, the select transistors $M_{S5}$, $M_{S6}$, $M_{S7}$ and $M_{S8}$ in the differential memory cells c21 and c22 are turned off. Consequently, the differential memory cells c21 and c22 are unable to generate the read current. That is, the differential memory cells c21 and c22 in the unselected row are subjected to the read inhibition.

As mentioned above, the first row is the selected row. In addition, the bit line BL1 receives the ground voltage (0V), the inverted bit line BL1' receives the ground voltage (0V), the bit line BL2 is in the floating state (FLT), and the inverted bit line BL2' is in the floating state (FLT). In the first row, the differential memory cell c11 is the selected memory cell, and the differential memory cell c12 is the unselected memory cell. The unselected memory cell is subjected to the read inhibition. During the read operation (READ), the bit line BL1 and the inverted bit line BL1' of the selected memory cell generate read currents. The storage state of the selected memory cell (i.e., the differential memory cell c11) can be judged according to the magnitudes of the read currents on the bit line BL1 and the inverted bit line BL1', respectively.

Please refer to FIGS. 4A and 4D. When the erase operation (ERS) is performed, the source line SL receives the ground voltage (0V), the word line WL1 receives the ground voltage (0V), the word line WL2 receives the program voltage Vpp, the bit line BL1 receives the ground voltage (0V), the inverted bit line BL1' receives the ground voltage (0V), the bit line BL2 is in the floating state (FLT), the inverted bit line BL2' is in the floating state (FLT), the erase line EL1 receives an erase voltage Vee, and the erase line EL2 receives the ground voltage (0V). In addition, the well region voltage $V_{NW1}$ is equal to the ground voltage (0V), and the well region voltage $V_{NW2}$ is equal to the program voltage Vpp.

In the array structure, the word line WL1 receives the ground voltage (0V). Consequently, the word line WL1 is activated, and the first row connected to the word line WL1 is the selected row. Since the word line WL2 receives the program voltage Vpp, the word line WL2 is inactivated. In addition, the second row of the array structure connected to the word line WL2 is the unselected row.

For example, the differential memory cells c21 and c22 in the unselected row are unselected memory cells. Since the voltage difference between the erase line EL1 and the body terminal of the floating gate transistor $M_{F5}$ (or the floating gate transistor $M_{F6}$) of the differential memory cell c21 is equal to the difference between the erase voltage Vee and the well region voltage $V_{NW2}$, i.e., equal to (Vee–Vpp), the Fowler-Nordheim (FN) electron tunneling ejection effect cannot be generated. Similarly, the voltage difference between the erase line EL2 and the body terminal of the floating gate transistor $M_{F7}$ (or the floating gate transistor $M_{F8}$) of the differential memory cell c22 is equal to the difference between the ground voltage and the well region voltage $V_{NW2}$, i.e., equal to (0–Vpp). Consequently, the Fowler-Nordheim (FN) electron tunneling ejection effect cannot be generated. In other words, the differential memory cells c21 and c22 are subjected to the erase inhibition.

The differential memory cell c12 in the selected row is also an unselected memory cell. Since the voltage difference between the erase line EL2 and the body terminal of the floating gate transistor $M_{F3}$ (or the floating gate transistor $M_{F4}$) of the differential memory cell c12 is equal to the difference between the ground voltage and the well region voltage $V_{NW2}$, i.e., equal to 0V, the Fowler-Nordheim (FN) electron tunneling ejection effect cannot be generated. In other words, the differential memory cell c12 is subjected to the erase inhibition.

The differential memory cell c11 in the selected row is a selected memory cell. Since the voltage difference between the erase line EL1 and the body terminal of the floating gate transistor $M_{F1}$ (or the floating gate transistor $M_{F2}$) is equal to the difference between the erase voltage Vee and the well region voltage $V_{NW1}$, i.e., equal to (Vee–0V), the selected memory cell results in the Fowler-Nordheim (FN) electron tunneling ejection effect. Consequently, the stored data in the selected memory cell is erased.

In the MTP non-volatile memory of this embodiment, the stored data in the differential memory cells of the selected row are not all erased after the erase operation (ERS) is completed. That is, only the stored data in a single selected memory cell of the selected row is erased.

However, due to the variation of the semiconductor manufacturing process, some unselected memory cells are possibly subjected to a soft erase condition. For example, as shown in FIG. 4D, the differential memory cell c21 in the same column with the selected memory cell (i.e., the differential memory cell c11) is subjected to the erase inhibition. In the differential memory cell c21, the voltage difference between the erase line EL1 and the second drain/source terminal of the floating gate transistor $M_{F5}$ (or the floating gate transistor $M_{F6}$) is equal to Vee (i.e., Vee–0). In case that the characteristics of the floating gate transistors $M_{F5}$ and $M_{F6}$ are deteriorated, the hot carriers in the floating gate transistors $M_{F5}$ and $M_{F6}$ are possibly ejected to the bit line BL1 and the inverted bit line BL1'. Consequently, the stored data in the differential memory cell c21 are gradually lost.

Figure 5A:
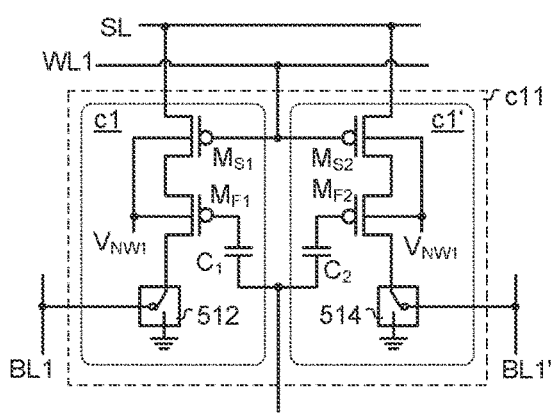
FIG. 5A is a schematic circuit diagram illustrating an equivalent circuit of a differential memory cell according to a second embodiment of the present invention.
Figure 5B:
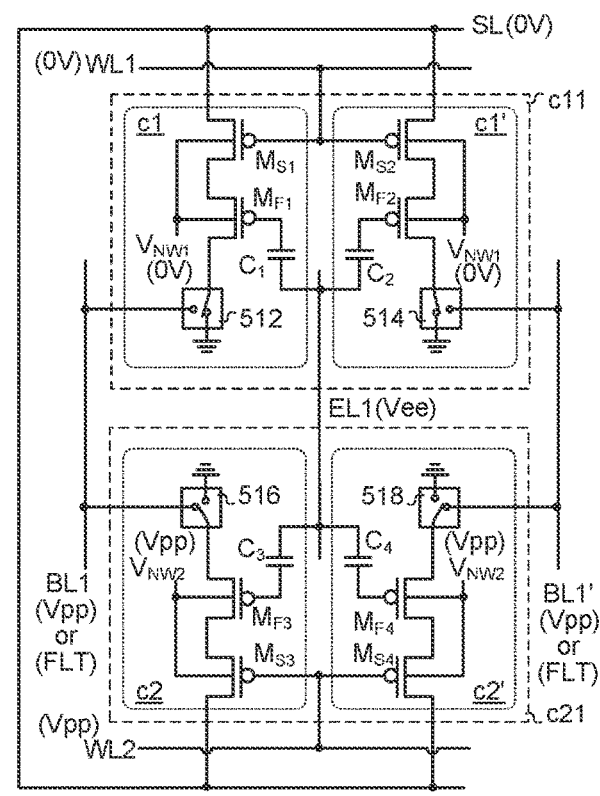
FIG. 5B is a schematic circuit diagram illustrating the equivalent circuit of an array structure with plural differential memory cells of the second embodiment.

For overcoming the above drawbacks, the differential memory cell of the first embodiment may be modified. FIG. 5A is a schematic circuit diagram illustrating an equivalent circuit of a differential memory cell according to a second embodiment of the present invention. FIG. 5B is a schematic circuit diagram illustrating the equivalent circuit of an array structure with plural differential memory cells of the second embodiment.

As shown in FIG. 5A, the differential memory cell c11 comprises two sub-cells c1 and c1'. The structures of the two sub-cells c1 and c1' are identical. In comparison with the differential memory cell of the first embodiment, the differential memory cell c11 of this embodiment further comprises two coupling devices 512 and 514. For brevity, only the connecting relationships between the two coupling devices 512 and 514 and the associated components and the operating principles of the two coupling devices 512 and 514 will be described as follows.

The first terminal of the coupling device 512 is connected to the second drain/source terminal of the floating gate transistor $MF_1$. The second terminal of the coupling device 512 is connected to the bit line BL1. The third terminal of the coupling device 512 is connected to a ground terminal. The first terminal of the coupling device 514 is connected to the second drain/source terminal of the floating gate transistor $MF_2$. The second terminal of the coupling device 514 is connected to the inverted bit line BL1'. The third terminal of the coupling device 514 is connected to the ground terminal.

When the program operation (PGM) and the read operation (READ) are performed, the first terminal and the second terminal of the coupling device 512 are connected with each other, and the first terminal and the second terminal of the coupling device 514 are connected with each other. That is, the second drain/source terminal of the floating gate transistor $MF_1$ is coupled to the bit line BL1 through the coupling device 512, and the second drain/source terminal of the floating gate transistor $MF_2$ is coupled to the inverted bit line BL1' through the coupling device 514. In other words, when the program operation (PGM) and the read operation (READ) are performed, the bias voltages and the operating principles for the differential memory cell of the second embodiment are similar to those of the first embodiment, and not redundantly described herein.

Moreover, when the erase operation (ERS) is performed, the coupling devices 512 and 514 of the differential memory cell c11 are switched according to the result of judging whether the word line WL1 is activated. For example, if the word line WL1 is inactivated when the erase operation (ERS) is performed, the first terminal and the second terminal of the coupling device 512 are connected with each other, and the first terminal and the second terminal of the coupling device 514 are connected with each other. That is, the second drain/source terminal of the floating gate transistor $MF_1$ is coupled to the bit line BL1 through the coupling device 512, and the second drain/source terminal of the floating gate transistor $MF_2$ is coupled to the inverted bit line BL1' through the coupling device 514.

Whereas, if the word line WL1 is activated when the erase operation (ERS) is performed, the first terminal and the third terminal of the coupling device 512 are connected with each other, and the first terminal and the third terminal of the coupling device 514 are connected with each other. That is, the second drain/source terminal of the floating gate transistor $MF_1$ is coupled to the ground terminal through the coupling device 512, and the second drain/source terminal of the floating gate transistor $MF_2$ is coupled to the ground terminal through the coupling device 514.

FIG. 5B also illustrates the bias voltages for performing the erase operation on the array structure. For illustration, the array structure of this embodiment comprises two differential memory cells c11~c21 in a 2×1 array. It is noted that the number of the differential memory cells may be increased according to the practical requirements. For example, in other embodiments, the plural differential memory cells are arranged in a 2×2 array or an m×n array, wherein m and n are positive integers. The equivalent circuit of each of the differential memory cells c11~c21 is identical to that of FIG. 5A, and not redundantly described herein.

The differential memory cell c11 comprises two sub-cells c1 and c1'. The differential memory cell c21 comprises two sub-cells c2 and c2'. The source line SL is connected to the first drain/source terminals of the select transistors $M_{S1}$, $M_{S2}$, $M_{S3}$ and $M_{S4}$. The word line WL1 is connected to the gate terminals of the select transistors $M_{S1}$ and $M_{S2}$. The word line WL2 is connected to the gate terminals of the select transistors $M_{S3}$ and $M_{S4}$. The bit line BL1 is connected to the second terminals of the coupling devices 512 and 516. The inverted bit line BL2' is connected to the second ends of the coupling devices 514 and 518. The erase line EL1 is connected to the second terminals of the capacitors $C_1$, $C_2$, $C_3$ and $C_4$.

The bias voltages and the operating principles of performing the program operation (PGM) and the read operation (READ) on the array structure of FIG. 5B are similar to those of FIGS. 4B and 4C, and not redundantly described herein.

Please refer to FIG. 5B again. When the erase operation (ERS) is performed, the source line SL receives the ground voltage (0V), the word line WL1 receives the ground voltage (0V), the word line WL2 receives the program voltage Vpp, the erase line EL1 receives an erase voltage Vee, and the well region voltage $V_{NW1}$ is equal to the ground voltage (0V). Moreover, both of the bit line BL1 and the inverted bit line BL1' receive the program voltage Vpp, or both of the bit line BL1 and the inverted bit line BL1' are in the floating state (FLT).

In the array structure, the word line WL1 receives the ground voltage (0V). Consequently, the word line WL1 is activated, and the first row connected to the word line WL1 is the selected row. The first terminal and the third terminal of the coupling device 512 are connected with each other. The first terminal and the third terminal of the coupling device 514 are connected with each other. Since the word line WL2 receives the program voltage Vpp, the word line WL2 is inactivated. In addition, the second row of the array structure connected to the word line WL2 is the unselected row. The first terminal and the second terminal of the coupling device 516 are connected with each other, and the first terminal and the second terminal of the coupling device 518 are connected with each other.

The differential memory cell c11 in the selected row is a selected memory cell. Since the voltage difference between the erase line EL1 and the body terminal of the floating gate transistor $M_{F1}$ (or the floating gate transistor $M_{F2}$) is equal to the difference between the erase voltage Vee and the well region voltage $V_{NW1}$, i.e., equal to (Vee–0V), the selected memory cell results in the Fowler-Nordheim (FN) electron tunneling ejection effect. Consequently, the stored data in the selected memory cell is erased.

The differential memory cell c21 in the unselected row is an unselected memory cell. Since the voltage difference between the erase line EL1 and the body terminal of the floating gate transistor $M_{F3}$ (or the floating gate transistor $M_{F4}$) of the differential memory cell c21 is equal to (Vee–Vpp), the Fowler-Nordheim (FN) electron tunneling ejection effect cannot be generated. In other words, the differential memory cell c21 in the unselected row is subjected to the erase inhibition.

Moreover, since the voltage difference between the erase line EL1 and the second drain/source terminals of the floating gate transistor $M_{F3}$ (or the floating gate transistor $M_{F4}$) of the differential memory cell c21 is equal to (Vee–Vpp) or zero, the soft erase condition of the differential memory cell c21 will not occur. In other words, when the erase operation (ERS) is performed, the hot carriers in the floating gate transistors $M_{F3}$ and $M_{F4}$ will not be ejected to the bit line BL1 and the inverted bit line BL1'.

Figure 6A:
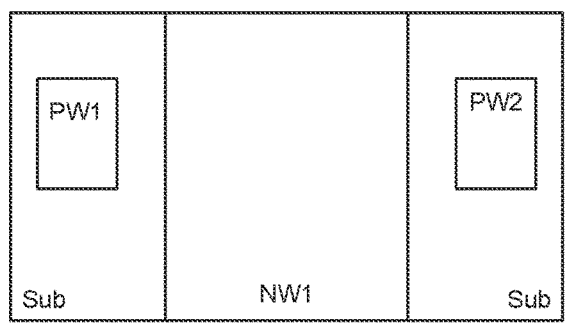
FIGS. 6A, 6B and 6C are schematic views illustrating a manufacturing process of a differential memory cell according to a third embodiment of the present invention.
Figure 6C:
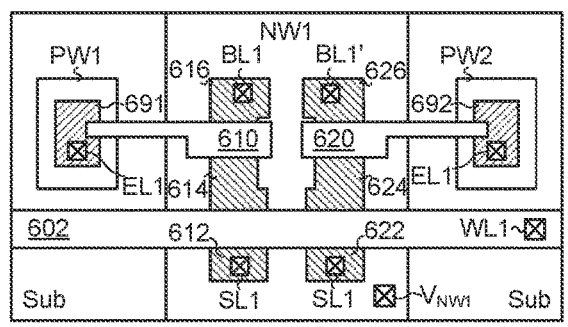
Figure 6B:
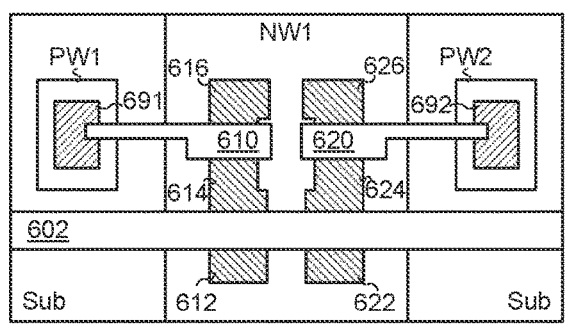
Figure 6D:
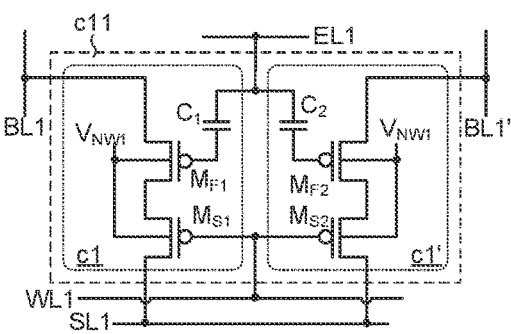
FIG. 6D is a schematic circuit diagram illustrating an equivalent circuit of the differential memory cell according to the third embodiment of the present invention.

FIGS. 6A, 6B and 6C are schematic views illustrating a manufacturing process of a differential memory cell according to a third embodiment of the present invention. FIG. 6D is a schematic circuit diagram illustrating an equivalent circuit of the differential memory cell according to the third embodiment of the present invention.

Please refer to FIG. 6A. Firstly, an N-well region NW1, a P-well region PW1 and a P-well region PW2 are formed in a surface of a semiconductor substrate Sub.

Please refer to FIG. 6B. Then, plural gate structures 602, 610 and 620 are formed. The gate structure 602 covers the semiconductor substrate Sub and the N-well region NW1. The gate structures 610 and 620 cover the N-well region NW1. In addition, the gate structure 610 is extended to the P-well region PW1 through the overlying region of the semiconductor substrate Sub, and the gate structure 620 is extended to the P-well region PW2 through the overlying region of the semiconductor substrate Sub. That is, the gate structure 610 covers both of the N-well region NW1 and the P-well region PW1, and the gate structure 620 covers both of the N-well region NW1 and the P-well region PW2. Each of the gate structures 602, 610 and 620 comprises a gate oxide layer and a polysilicon gate layer. The gate oxide layer covers the surface of the semiconductor substrate Sub. The polysilicon gate layer covers the gate oxide layer.

Then, a first doping process is performed to form plural p-type doped regions 612, 614, 616, 622, 624 and 626 in the N-well region NW1. The p-type doped region 612 is located beside a first side of the gate structure 602. The p-type doped region 614 is arranged between a second side of the gate structure 602 and a first side of the gate structure 610. The p-type doped region 616 is located beside a second side of the gate structure 610. The p-type doped region 622 is located beside the first side of the gate structure 602. The p-type doped region 624 is arranged between the second side of the gate structure 602 and a first side of the gate structure 620. The p-type doped region 626 is located beside a second side of the gate structure 620.

Then, a second doping process is performed to form n-type doped regions 691 and 692 in the P-well regions PW1 and PW2. As shown in FIG. 6B, the portions of the gate structure 610 extended to the P-well region PW1 are located beside n-type doped region 691, and the portions of the gate structure 620 extended to the P-well region PW2 are located beside n-type doped region 692.

It is noted that the sequence of performing the two doping processes may be exchanged. That is, the n-type doped regions 691 and 692 are formed in the P-well regions PW1 and PW2 after the first doping process, and the p-type doped regions 612, 614, 616, 622, 624 and 626 are formed in the N-well region NW1 after the second doping process.

Please refer to FIG. 6C. Then, a connection process is performed to form plural metal contact lines. The metal contact line connected to the p-doped regions 612 and 622 is served as a source line SL1. The metal contact line connected to the p-doped region 616 is serves as a bit line BL1. The metal contact line connected to the p-doped region 626 is served as an inverted bit line BL1'. The metal contact line connected to the gate structure 602 is served as a word line WL1. The metal contact line connected to the n-doped region 691 is served as an erase line EL1. The metal contact line connected to the n-doped region 692 is also served as the erase line EL1. In addition, a metal contact line is connected to the N-well region NW1, and thus the N-well region NW1 receives a well region voltage VNW1.

As shown in FIG. 6D, the differential memory cell c11 comprises two sub-cells c1 and c1'. The structures of the two sub-cells c1 and c1' are identical.

The sub-cell c1 comprises a select transistor $M_{S1}$, a floating gate transistor $M_{F1}$ and a capacitor $C_1$. The select transistor $M_{S1}$ is defined by the N-well region NW1, the p-type doped region 612, the p-type doped region 614 and the gate structure 602 collaboratively. The floating gate transistor $M_{F1}$ is defined by the N-well region NW1, the p-type doped region 614, the p-type doped region 616 and the gate structure 610 collaboratively. The capacitor $C_1$ is defined by the gate structure 610 and the n-doped region 691 collaboratively. The first source/drain terminal of the select transistor $M_{S1}$ is connected to the source line SL1. The gate terminal of the select transistor $M_{S1}$ is connected to the word line WL1. The first drain/source terminal of the floating gate transistor $M_{F1}$ is connected to the second drain/source terminal of the select transistor $M_{S1}$. The second drain/source terminal of the floating gate transistor $M_{F1}$ is connected to the bit line BL1. The first terminal of the capacitor $C_1$ is connected to a floating gate of the floating gate transistor $M_{F1}$. The second terminal of the capacitor $C_1$ is connected to the erase line EL1. Moreover, a body terminal of the transistor $M_{S1}$ and a body terminal of the floating gate transistor $M_{F1}$ receive the well region voltage $V_{NW1}$.

The sub-cell c1' comprises a select transistor $M_{S2}$, a floating gate transistor $M_{F2}$ and a capacitor $C_2$. The select transistor $M_{S2}$ is defined by the N-well region NW1, the p-type doped region 622, the p-type doped region 624 and the gate structure 602 collaboratively. The floating gate transistor $M_{F2}$ is defined by the N-well region NW1, the p-type doped region 624, the p-type doped region 626 and the gate structure 620 collaboratively. The capacitor $C_2$ is defined by the gate structure 620 and the n-doped region 692 collaboratively. The first drain/source terminal of the select transistor $M_{S2}$ is connected to the source line SL1. The gate terminal of the select transistor $M_{S2}$ is connected to the word line WL1. The first drain/source terminal of the floating gate transistor $M_{F2}$ is connected to the second drain/source select transistor $M_{S2}$. The second drain/source terminal of the floating gate transistor $M_{F2}$ is connected to the inverted bit line BL1'. The first terminal of the capacitor $C_2$ is connected to a floating gate of the floating gate transistor $M_{F2}$. The second terminal of the capacitor $C_2$ is connected to the erase line EL1. Moreover, a body terminal of the transistor $M_{S2}$ and a body terminal of the floating gate transistor $M_{F2}$ receive the well region voltage VNW1.

The relationships between the components of the differential memory cell c11 as shown in FIG. 6D are similar to those of the differential memory cell c11 as shown in FIG. 1D, and not redundantly described herein. Consequently, the bias voltages for performing the program operation (PGM), the read operation (READ) and the erase operation (RES) on the differential memory cell c11 of the third embodiment are similar to those of the differential memory cell c11 of the first embodiment.

The relationships between the components of the differential memory cell of the third embodiment are similar to those of the differential memory cell of the first embodiment. However, the array structure composed of the differential memory cells of the third embodiment are distinguished from the array structure of the first embodiment.

Figure 7A:
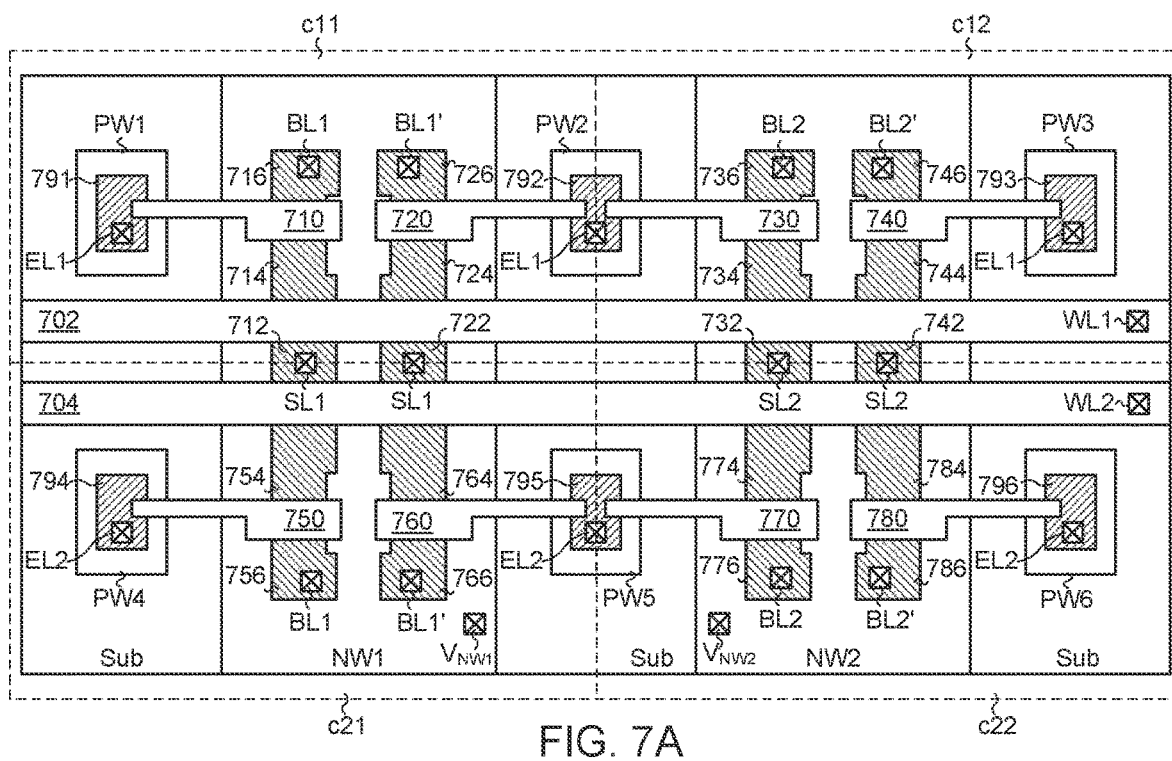
FIG. 7A is a schematic top view illustrating the array structure of a MTP non-volatile memory with plural differential memory cells of the third embodiment.
Figure 7B:
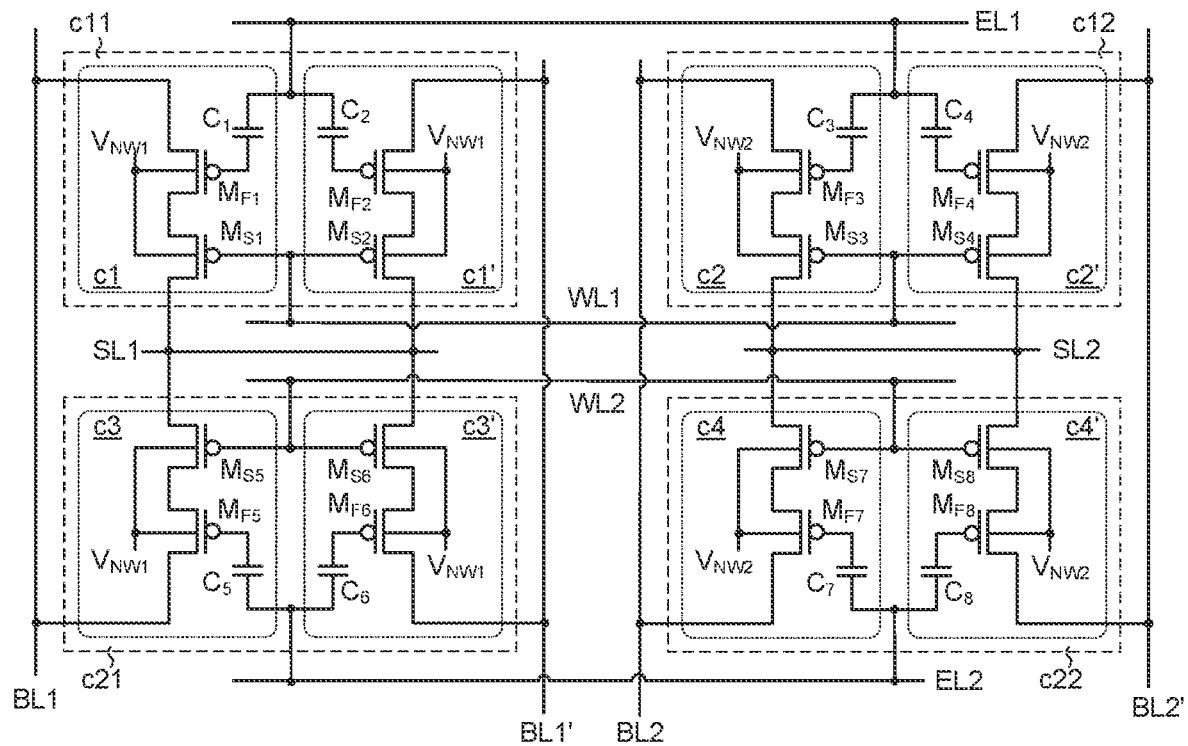
FIG. 7B is a schematic circuit diagram illustrating the equivalent circuit of the array structure as shown in FIG. 7A.

FIG. 7A is a schematic top view illustrating the array structure of a MTP non-volatile memory with plural differential memory cells of the third embodiment. FIG. 7B is a schematic circuit diagram illustrating the equivalent circuit of the array structure as shown in FIG. 7A. The MTP non-volatile memory comprises four differential memory cells c11~c22 that are arranged in a 2×2 array. It is noted that the MTP non-volatile memory may comprise plural differential memory cells that are arranged in an m×n array, wherein m and n are positive integers.

A manufacturing process of the array structure as shown in FIG. 7A will be described as follows. Firstly, two N-well regions NW1, NW2 and six P-well regions PW1, PW2, PW3, PW4, PW5, PW6 are formed in a surface of a semiconductor substrate Sub. The two N-well regions NW1 and NW2 are discretely located at two opposite sides of the semiconductor substrate Sub. In this embodiment, the semiconductor substrate Sub is a P-type semiconductor substrate.

Then, plural gate structures 702, 704, 710, 720, 730, 740, 750, 760, 770 and 780 are formed. The gate structures 702 and 704 cover the surface of the semiconductor substrate Sub and the two N-well regions NW1 and NW2. The gate structure 710 covers the N-well region NW1 and the P-well region PW1. The gate structure 720 covers the N-well region NW1 and the P-well region PW2. The gate structure 730 covers the N-well region NW2 and the P-Well region PW2. The gate structure 740 covers the N-well region NW2 and the P-well region PW3. The gate structure 750 covers the N-well region NW1 and the P-well region PW4. The gate structure 760 covers the N-well region NW1 and the P-well region PW5. The gate structure 770 covers the N-well region NW2 and the P-well region PW5. The gate structure 780 covers the N-well region NW2 and the P-well region PW6.

Then, a first doping process is performed. Consequently, plural p-type doped regions 712~716, 722~726, and 754~756, 764~766 are formed in the N-well region NW1 and plural p-type doped regions 732~736, 742~746, 774~776 and 784~786 are formed in the N-well region NW2. Take the p-type doped regions 712~716 for example. The p-type doped region 712 is arranged between a first side of the gate structure 702 and a first side of the gate structure 704. The p-type doped region 714 is arranged between a second side of the gate structure 702 and a first side of the gate structure 710. The p-type doped region 716 is located beside a second side of the gate structure 710. The locations of the other p-type doped regions are not redundantly described herein.

Then, a second doping process is performed. Consequently, an n-type doped regions 791, 792, 793, 794, 795 and 796 are formed in the P-well regions PW1, PW2, PW3, PW4, PW5 and PW6, respectively. The portion of the gate structure 710 extended to the P-well region PW1 is located beside n-type doped region 791. The portions of the gate structures 720 and 730 extended to the P-well region PW2 are located beside n-type doped region 792. The portion of the gate structure 740 extended to the P-well region PW3 is located beside n-type doped region 793. The portion of the gate structure 750 extended to the P-well region PW4 is located beside n-type doped region 794. The portions of the gate structures 760 and 770 extended to the P-well region PW5 are located beside n-type doped region 795. The portion of the gate structure 780 extended to the P-well region PW6 is located beside n-type doped region 796.

Then, a connection process is performed to form plural metal contact lines SL1, SL2, WL1, WL2, BL1, BL1', BL2, BL2', EL1 and EL2. The source line SL1 is connected to the p-type doped regions 712 and 722. The source line SL2 is connected to the p-type doped regions 732 and 742. The bit line BL1 is connected to the p-type doped regions 716 and 756. The inverted bit line BL1' is connected to the p-type doped regions 726 and 766. The bit line BL2 is connected to the p-type doped regions 736 and 776. The inverted bit line BL2' is connected to the p-type doped regions 746 and 786. The word line WL1 is connected to the gate structure 702. The word line WL2 is connected to the gate structure 704. The erase line EL1 is connected to the n-doped regions 791, 792 and 793. The erase line EL2 is connected to the n-doped region 794, 795 and 796. The N-well region NW1 receives a well region voltage $V_{NW1}$. The N-well region NW2 receives a well region voltage $V_{NW2}$.

As shown in FIG. 7B, the array structure comprises four differential memory cells c11~c22 in a 2×2 array. The equivalent circuit of each of the differential memory cells c11~c22 is identical to that of FIG. 6D, and not redundantly described herein. The differential memory cell c11 comprises two sub-cells c1 and c1'. The differential memory cell c12 comprises two sub-cells c2 and c2'. The differential memory cell c21 comprises two sub-cells c3 and c3'. The differential memory cell c22 comprises two sub-cells c4 and c4'.

In the array structure of FIG. 7B, the differential memory cells in the same row are constructed in different well regions. For example, the select transistors $M_{S1}$ and $M_{S2}$ and the floating gate transistors $M_{F1}$ and $M_{F2}$ of the differential memory cell c11 in the first row are constructed in the N-well region NW1. The select transistors $M_{S3}$ and $M_{S4}$ and the floating gate transistors $M_{F3}$ and $M_{F4}$ of the differential memory cell c12 in the first row are constructed in the N-well region NW2. That is, the body terminals of the select transistors $M_{S1}$ and $M_{S2}$ and the floating gate transistors $M_{F1}$ and $M_{F2}$ of the differential memory cells c11 in the first row receive the well region voltage $V_{NW1}$. The body terminals of the select transistors $M_{S3}$ and $M_{S4}$ and the floating gate transistors $M_{F3}$ and $M_{F4}$ of the differential memory cells c12 in the first row receive the well region voltage $V_{NW2}$.

Similarly, the select transistors $M_{S5}$ and $M_{S6}$ and the floating gate transistors $M_{F5}$ and $M_{F6}$ of the differential memory cell c21 in the second row are constructed in the N-well region NW1. The select transistors $M_{S7}$ and $M_{S8}$ and the floating gate transistors $M_{F7}$ and $M_{F8}$ of the differential memory cell c22 in the second row are constructed in the N-well region NW2. That is, the body terminals of the select transistors $M_{S5}$ and $M_{S6}$ and the floating gate transistors $M_{F5}$ and $M_{F6}$ of the differential memory cells c21 in the second row receive the well region voltage $V_{NW1}$. The body terminals of the select transistors $M_{S7}$ and $M_{S8}$ and the floating gate transistors $M_{F7}$ and $M_{F8}$ of the differential memory cells c22 in the second row receive the well region voltage $V_{NW2}$.

Moreover, the source line SL1 is connected to the differential memory cells c11 and c21, and the source line SL2 is connected to the differential memory cells c12 and c22. That is, the source line SL1 is connected to the first drain/source terminals of the select transistors $M_{S1}$, $M_{S2}$, $M_{S5}$ and $M_{S6}$, and the source line SL2 is connected to the first drain/source terminals of the select transistors $M_{S3}$, $M_{S4}$, $M_{S7}$ and $M_{S8}$.

The word line WL1 is connected to the two differential memory cells c11 and c12 in the first row. That is, the word line WL1 is connected to the gate terminals of the select transistors $M_{S1}$, $M_{S2}$, $M_{S3}$ and $M_{S4}$. The word line WL2 is connected to the two differential memory cells c21 and c22 in the second row. That is, the word line WL2 is connected to the gate terminals of the select transistors $M_{S5}$, $M_{S6}$, $M_{S7}$ and $M_{S8}$.

The bit line BL1 and the inverted bit line BL1' are connected to the two differential memory cells c11 and c21 in the same column. That is, the bit line BL1 is connected to the second drain/source terminals of the floating gate transistors $M_{F1}$ and $M_{F6}$, and the inverted bit line BL1' is connected to the second drain/source terminals of the floating gate transistors $M_{F2}$ and $M_{F6}$. The bit line BL2 and the inverted bit line BL2' are connected to the two differential memory cells c12 and c22 in the same column. That is, the bit line BL2 is connected to the second drain/source terminals of the floating gate transistors $M_{F3}$ and $M_{F7}$, and the inverted bit line BL2' is connected to the second drain/source terminals of floating gate transistors $M_{F4}$ and $M_{F8}$.

The erase line EL1 is connected to two differential memory cells c11 and c12 in the same row. That is, the erase line EL1 is connected to the second terminals of the capacitors $C_1$, $C_2$, $C_3$ and $C_4$. The erase line EL2 is connected to two differential memory cells c21 and c22 in the same row. That is, the erase line EL2 is connected to the second terminals of the capacitors $C_5$, $C_6$, $C_7$ and $C_8$.

Figures 8A, 8B:
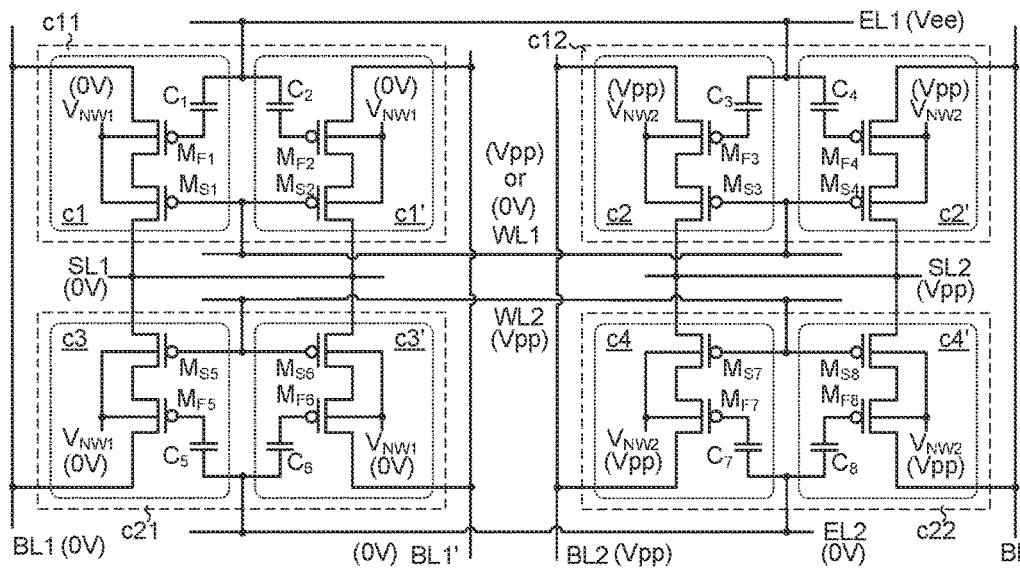
FIG. 8A is a bias voltage table illustrating the bias voltages for performing a program operation, a read operation and an erase operation on the differential memory cell array structure as shown in FIG. 7B.
FIG. 8B is a schematic circuit diagram illustrating associated bias voltages for performing the erase operation on the differential memory cell array structure as shown in FIG. 7B.

FIG. 8A is a bias voltage table illustrating the bias voltages for performing a program operation, a read operation and an erase operation on the differential memory cell array structure as shown in FIG. 7B. The bias voltages and the operating principles of performing the program operation (PGM) and the read operation (READ) on the array structure of FIG. 7B are similar to those of FIGS. 4B and 4C, and not redundantly described herein.

FIG. 8B is a schematic circuit diagram illustrating associated bias voltages for performing the erase operation on the differential memory cell array structure as shown in FIG. 7B. When the erase operation (ERS) is performed, the source line SL1 receives a ground voltage (0V), the source line SL2 receives a program voltage Vpp, the word line WL1 receives the ground voltage (0V) or the program voltage Vpp, the word line WL2 receives the program voltage Vpp, the bit line BL1 receives the ground voltage (0V), the inverted bit line BL1' receive the ground voltage (0V), the bit line BL2 receives the program voltage Vpp, the inverted bit line BL2' receive the program voltage Vpp, the erase line EL1 receives an erase voltage Vee, and the erase line EL2 receives the ground voltage (0V). In addition, the well region voltage $V_{NW1}$ is equal to the ground voltage (0V), and the well region voltage $V_{NW2}$ is equal to the program voltage Vpp.

In the array structure, the erase line EL1 receives the erase voltage Vee. Consequently, the first row connected to the erase line EL1 is the selected row. Since the erase line EL2 receives the ground voltage (0V), the second row of the array structure connected to the erase line EL2 is the unselected row.

For example, the differential memory cells c21 and c22 in the unselected row are unselected memory cells. Since the voltage difference between the erase line EL1 and the body terminal of the floating gate transistor $M_{F5}$ (or the floating gate transistor $M_{F6}$) of the differential memory cell c21 is equal to 0V, the Fowler-Nordheim (FN) electron tunneling ejection effect cannot be generated. Similarly, the voltage difference between the erase line EL2 and the body terminal of the floating gate transistor $M_{F7}$ (or the floating gate transistor $M_{F8}$) of the differential memory cell c22 is equal to the difference between the ground voltage (0V) and the well region voltage $V_{NW2}$, i.e., equal to (0−Vpp). Consequently, the Fowler-Nordheim (FN) electron tunneling ejection effect cannot be generated. In other words, the differential memory cells c21 and c22 are subjected to the erase inhibition.

The differential memory cell c12 in the selected row is also an unselected memory cell. Since the voltage difference between the erase line EL1 and the body terminal of the floating gate transistor $M_{F3}$ (or the floating gate transistor $M_{F4}$) of the differential memory cell c12 is equal to the difference between the erase voltage Vee and the well region voltage $V_{NW2}$, i.e., equal to (Vee–Vpp), the Fowler-Nordheim (FN) electron tunneling ejection effect cannot be generated. In other words, the differential memory cell c12 is subjected to the erase inhibition.

The differential memory cell c11 in the selected row is a selected memory cell. Since the voltage difference between the erase line EL1 and the body terminal of the floating gate transistor $M_{F1}$ (or the floating gate transistor $M_{F2}$) is equal to the difference between the erase voltage Vee and the well region voltage $V_{NW1}$, i.e., equal to (Vee–0V), the selected memory cell results in the Fowler-Nordheim (FN) electron tunneling ejection effect. Consequently, the stored data in the selected memory cell is erased.

In the MTP non-volatile memory of this embodiment, the stored data in the differential memory cells of the selected row are not all erased after the erase operation (ERS) is completed. That is, only the stored data in a single selected memory cell of the selected row is erased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A differential memory cell array structure comprising a first differential memory cell, wherein the first differential memory cell comprises:
    a first select transistor, wherein a first source/drain terminal of the first select transistor is connected to a first source line, a gate terminal of the first select transistor is connected to a first word line, and a body terminal of the first select transistor receives a first well region voltage;
    a first floating gate transistor, wherein a first drain/source terminal of the first floating gate transistor is connected to a second drain/source terminal of the first select transistor, a second drain/source terminal of the first floating gate transistor is coupled to a first bit line, and a body terminal of the first floating gate transistor receives the first well region voltage;
    a first capacitor, wherein a first terminal of the first capacitor is connected to a floating gate of the first floating gate transistor, and a second terminal of the first capacitor is connected to a first erase line;
    a second select transistor, wherein a first source/drain terminal of the second select transistor is connected to the first source line, a gate terminal of the second select transistor is connected to the first word line, and a body terminal of the second select transistor receives the first well region voltage;
    a second floating gate transistor, wherein a first drain/source terminal of the second floating gate transistor is connected to a second drain/source terminal of the second select transistor, a second drain/source terminal of the second floating gate transistor is coupled to a first inverted bit line, and a body terminal of the second floating gate transistor receives the first well region voltage; and
    a second capacitor, wherein a first terminal of the second capacitor is connected to a floating gate of the second floating gate transistor, and a second terminal of the second capacitor is connected to the first erase line;
    wherein the differential memory cell array structure further comprises:
    a semiconductor substrate;
    a first N-well region formed under a surface of the semiconductor substrate;
    a first P-well region formed under the surface of the semiconductor substrate;
    a first gate structure covered on the first N-well region;
    a second gate structure covered on the first N-well region and the first P-well region;
    a third gate structure covered on the first N-well region and the first P-well region;
    a first p-type doped region formed in the first N-well region, and located beside a first side of the first gate structure;
    a second p-type doped region formed in the first N-well region, and arranged between a second side of the first gate structure and a first side of the second gate structure;
    a third p-type doped region formed in the first N-well region, and located beside a second side of the second gate structure;
    a fourth p-type doped region formed in the first N-well region, and located beside the first side of the first gate structure;
    a fifth p-type doped region formed in the first N-well region, and arranged between the second side of the first gate structure and a first side of the third gate structure;
    a sixth p-type doped region formed in the first N-well region, and located beside a second side of the third gate structure; and
    a first n-type doped region formed in the first P-well region,
    wherein a portion of the second gate structure is extended to the first P-well region and located beside the first n-type doped region, and a portion of the third gate structure is extended to the first P-well region and located beside the first n-type doped region,
    wherein the first select transistor is defined by the first N-well region, the first p-type doped region, the second p-type doped region and the first gate structure collaboratively, the first floating gate transistor is defined by the first N-well region, the second p-type doped region, the third p-type doped region and the second gate structure collaboratively, the first capacitor is defined by the second gate structure and the first n-typed doped region collaboratively, the second select transistor is defined by the first N-well region, the fourth p-typed doped region, the fifth p-typed doped region and the first gate structure collaboratively, the second floating gate transistor is defined by the first N-well region, the fifth p-type doped region, the sixth p-type doped region and the third gate structure collaboratively, and the second capacitor is defined by the third gate structure and the first n-type doped region collaboratively.

2. A differential memory cell array structure comprising a first differential memory cell and a second differential memory cell, wherein the first differential memory cell comprises:

a first select transistor, wherein a first source/drain terminal of the first select transistor is connected to a first source line, a gate terminal of the first select transistor is connected to a first word line, and a body terminal of the first select transistor receives a first well region voltage;

a first floating gate transistor, wherein a first drain/source terminal of the first floating gate transistor is connected to a second drain/source terminal of the first select transistor, a second drain/source terminal of the first floating gate transistor is coupled to a first bit line, and a body terminal of the first floating gate transistor receives the first well region voltage;

a first capacitor, wherein a first terminal of the first capacitor is connected to a floating gate of the first floating gate transistor, and a second terminal of the first capacitor is connected to a first erase line;

a second select transistor, wherein a first source/drain terminal of the second select transistor is connected to the first source line, a gate terminal of the second select transistor is connected to the first word line, and a body terminal of the second select transistor receives the first well region voltage;

a second floating gate transistor, wherein a first drain/source terminal of the second floating gate transistor is connected to a second drain/source terminal of the second select transistor, a second drain/source terminal of the second floating gate transistor is coupled to a first inverted bit line, and a body terminal of the second floating gate transistor receives the first well region voltage; and a second capacitor, wherein a first terminal of the second capacitor is connected to a floating gate of the second floating gate transistor, and a second terminal of the second capacitor is connected to the first erase line;

wherein the second differential memory cell comprises:

a third select transistor, wherein a first source/drain terminal of the third select transistor is connected to the first source line, a gate terminal of the third select transistor is connected to the first word line, and a body terminal of the third transistor receives the first well region voltage;

a third floating gate transistor, wherein a first drain/source terminal of the third floating gate transistor is connected to a second drain/source terminal of the third select transistor, a second drain/source terminal of the third floating gate transistor is coupled to a second bit line, and a body terminal of the third floating gate transistor receives the first well region voltage;

a third capacitor, wherein a first terminal of the third capacitor is connected to a floating gate of the third floating gate transistor, and a second terminal of the third capacitor is connected to a second erase line;

a fourth select transistor, wherein a first source/drain terminal of the fourth select transistor is connected to the first source line, a gate terminal of the fourth select transistor is connected to the first word line, and a body terminal of the fourth select transistor receives the first well region voltage;

a fourth floating gate transistor, wherein a first drain/source terminal of the fourth floating gate transistor is connected to a second drain/source terminal of the fourth select transistor, a second drain/source terminal of the fourth floating gate transistor is coupled to a second inverted bit line, and a body terminal of the fourth floating gate transistor receives the first well region voltage; and a fourth capacitor, wherein a first terminal of the fourth capacitor is connected to a floating gate of the fourth floating gate transistor, and a second terminal of the fourth capacitor is connected to the second erase line.

3. The differential memory cell array structure as claimed in claim 2, further comprising a third differential memory cell, wherein the third differential memory cell comprises:

a fifth select transistor, wherein a first source/drain terminal of the fifth select transistor is connected to the first source line, a gate terminal of the fifth select transistor is connected to the second word line, and a body terminal of the fifth transistor receives a second well region voltage;

a fifth floating gate transistor, wherein a first drain/source terminal of the fifth floating gate transistor is connected to a second drain/source terminal of the fifth select transistor, a second drain/source terminal of the fifth floating gate transistor is coupled to the first bit line, and a body terminal of the fifth floating gate transistor receives the second well region voltage;

a fifth capacitor, wherein a first terminal of the fifth capacitor is connected to a floating gate of the fifth floating gate transistor, and a second terminal of the fifth capacitor is connected to the first erase line;

a sixth select transistor, wherein a first source/drain terminal of the sixth select transistor is connected to the first source line, a gate terminal of the sixth select transistor is connected to the second word line, and a body terminal of the sixth select transistor receives the second well region voltage;

a sixth floating gate transistor, wherein a first drain/source terminal of the sixth floating gate transistor is connected to a second drain/source terminal of the sixth select transistor, a second drain/source terminal of the sixth floating gate transistor is coupled to the first inverted bit line, and a body terminal of the sixth floating gate transistor receives the second well region voltage; and a sixth capacitor, wherein a first terminal of the sixth capacitor is connected to a floating gate of the sixth floating gate transistor, and a second terminal of the sixth capacitor is connected to the first erase line.

4. The differential memory cell array structure as claimed in claim 3, further comprising a fourth differential memory cell, wherein the fourth differential memory cell comprises:

a seventh select transistor, wherein a first source/drain terminal of the seventh select transistor is connected to the first source line, a gate terminal of the seventh select transistor is connected to the second word line, and a body terminal of the seventh transistor receives the second well region voltage;

a seventh floating gate transistor, wherein a first drain/source terminal of the seventh floating gate transistor is connected to a second drain/source terminal of the seventh select transistor, a second drain/source terminal of the seventh floating gate transistor is coupled to the second bit line, and a body terminal of the seventh floating gate transistor receives the second well region voltage;

a seventh capacitor, wherein a first terminal of the seventh capacitor is connected to a floating gate of the seventh floating gate transistor, and a second terminal of the seventh capacitor is connected to the second erase line;

an eighth select transistor, wherein a first source/drain terminal of the eighth select transistor is connected to the first source line, a gate terminal of the eighth select transistor is connected to the second word line, and a body terminal of the eighth select transistor receives the second well region voltage;

an eighth floating gate transistor, wherein a first drain/source terminal of the eighth floating gate transistor is connected to a second drain/source terminal of the eighth select transistor, a second drain/source terminal of the eighth floating gate transistor is coupled to the second inverted bit line, and a body terminal of the eighth floating gate transistor receives the second well region voltage; and an eighth capacitor, wherein a first terminal of the eighth capacitor is connected to a floating gate of the eighth floating gate transistor, and a second terminal of the eighth capacitor is connected to the second erase line.

5. The differential memory cell array structure as claimed in claim 4, wherein when a program operation is performed, the first well region voltage is equal to a program voltage, the second well region voltage is equal to the program voltage, the first source line receives the program voltage, the first word line receives a half of the program voltage, the second word line receives the program voltage, the first erase line receives the half of the program voltage, the second erase line receives a ground voltage, the first bit line receives the ground voltage, the first inverted bit line is in a floating state, the second bit line is in the floating state, and the second inverted bit line is in the floating state, so that the first differential memory cell is programmed to a first storage state.

6. The differential memory cell array structure as claimed in claim 4, wherein when a read operation is performed, the first well region voltage is equal to a read voltage, the second well region voltage is equal to the read voltage, the first source line receives the read voltage, the first word line receives an on voltage, the second word line receives an off voltage, the first erase line receives a ground voltage, the second erase line receives the ground voltage, the first bit line receives the ground voltage, the first inverted bit line receives the ground voltage, the second bit line is in a floating state, and the second inverted bit line is in the floating state, so that the first differential memory cell generates a first read current to the first bit line and generates a second read current to the first inverted bit line, wherein a storage state of the first differential memory cell is determined according to a magnitude of the first read current and a magnitude of the second read current.

7. The differential memory cell array structure as claimed in claim 4, wherein when an erase operation is performed, the first well region voltage is equal to a ground voltage, the second well region voltage is equal to a program voltage, the first source line receives the ground voltage, the first word line receives the ground voltage, the second word line receives the program voltage, the first erase line receives an erase voltage, the second erase line receives the ground voltage, the first bit line receives the ground voltage, the first inverted bit line receives the ground voltage, the second bit line is in a floating state, and the second inverted bit line is in the floating state, so that stored data in the first differential memory cell is erased.

* * * * *